United States Patent
Ishii et al.

(10) Patent No.: US 12,288,666 B2
(45) Date of Patent: Apr. 29, 2025

(54) MULTIPLE ELECTRON BEAM IMAGE ACQUISITION METHOD, MULTIPLE ELECTRON BEAM IMAGE ACQUISITION APPARATUS, AND MULTIPLE ELECTRON BEAM INSPECTION APPARATUS

(71) Applicant: NuFlare Technology, Inc., Yokohama (JP)

(72) Inventors: Koichi Ishii, Kawasaki (JP); Chosaku Noda, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 642 days.

(21) Appl. No.: 17/655,661

(22) Filed: Mar. 21, 2022

(65) Prior Publication Data

US 2022/0336183 A1      Oct. 20, 2022

(30) Foreign Application Priority Data

Apr. 14, 2021 (JP) ................................. 2021-068194
Dec. 6, 2021 (JP) ................................. 2021-197862

(51) Int. Cl.
*H01J 37/20* (2006.01)
*H01J 37/147* (2006.01)
(Continued)

(52) U.S. Cl.
CPC ...... *H01J 37/1477* (2013.01); *H01J 37/1471* (2013.01); *H01J 37/20* (2013.01);
(Continued)

(58) Field of Classification Search
CPC .... H01J 37/1477; H01J 37/1471; H01J 37/20; H01J 37/222; H01J 37/244; H01J 37/265;
(Continued)

(56) References Cited

U.S. PATENT DOCUMENTS

2007/0228277 A1 * 10/2007 Tsuneta ............... H01J 37/2955
                                                                    250/311
2008/0067376 A1      3/2008 Tanimoto et al.

FOREIGN PATENT DOCUMENTS

| CN | 109298001 A | 2/2019 |
| JP | 2006-196236 A | 7/2006 |
| JP | 4878501 B2 | 2/2012 |

OTHER PUBLICATIONS

Combined Taiwanese Office Action and Search Report issued Oct. 12, 2023 in Taiwanese Patent Application No. 111106306 (with unedited computer-generated English Translation), 19 pages.

* cited by examiner

*Primary Examiner* — Michael Maskell
(74) *Attorney, Agent, or Firm* — Oblon, McClelland, Maier & Neustadt, L.L.P.

(57) ABSTRACT

A multiple electron beam image acquisition method includes performing scanning with a representative secondary electron beam emitted, based on temporary secondary electron beam deflection conditions, for each of plural positions in a primary electron beam deflection range of a representative primary electron beam, acquiring plural coordinates corresponding to the plural positions, based on detected images of the representative secondary electron beam, each detected at any one of the plural positions in the primary electron beam deflection range of the representative primary electron beam, and calculating, using the plural coordinates acquired, secondary electron beam deflection conditions to cancel movement of the representative secondary electron beam due to movement of the representative primary electron beam in the primary electron beam deflection range of the representative primary electron beam and to fix the irradiation position of the representative secondary electron beam to the predetermined detection element.

12 Claims, 21 Drawing Sheets

(51) Int. Cl.
  *H01J 37/22* (2006.01)
  *H01J 37/244* (2006.01)
  *H01J 37/26* (2006.01)
(52) U.S. Cl.
  CPC .......... *H01J 37/222* (2013.01); *H01J 37/244* (2013.01); *H01J 37/265* (2013.01); *H01J 2237/2448* (2013.01); *H01J 2237/2806* (2013.01)
(58) Field of Classification Search
  CPC ....... H01J 2237/2448; H01J 2237/2806; H01J 2237/1501; H01J 2237/2817; H01J 37/28
  USPC ................................. 250/306, 307, 310, 311
  See application file for complete search history.

FIG.8C  Output Image from Detection Element

MULTIPLE ELECTRON BEAM IMAGE ACQUISITION METHOD, MULTIPLE ELECTRON BEAM IMAGE ACQUISITION APPARATUS, AND MULTIPLE ELECTRON BEAM INSPECTION APPARATUS

CROSS-REFERENCE TO RELATED APPLICATION

This application is based upon and claims the benefit of priority from prior Japanese Patent Application No. 2021-068194 filed on Apr. 14, 2021 in Japan, and prior Japanese Patent Application No. 2021-197862 filed on Dec. 6, 2021 in Japan, the entire contents of which are incorporated herein by reference.

BACKGROUND OF THE INVENTION

Field of the Invention

An embodiment of the present invention relates to a multiple electron beam image acquisition method, a multiple electron beam image acquisition apparatus, and a multiple electron beam inspection apparatus, and for example, relates to a method for acquiring an image by applying multiple primary electron beams to a substrate and detecting multiple secondary electron beams emitted from the substrate due to irradiation with the multiple primary electron beams.

Description of Related Art

With recent progress in high integration and large capacity of the LSI (Large Scale Integrated circuits), the line width (critical dimension) required for circuits of semiconductor elements is becoming increasingly narrower. Since LSI manufacturing requires an enormous production cost, it is essential to improve the yield. Meanwhile, as typified by 1 gigabit DRAMs (Dynamic Random Access Memories), the size of patterns which make up LSI is reduced from the order of submicrons to nanometers. Also, in recent years, with miniaturization of dimensions of LSI patterns formed on a semiconductor wafer, dimensions to be detected as a pattern defect have become extremely small. Therefore, the pattern inspection apparatus for inspecting defects of ultrafine patterns exposed/transferred onto a semiconductor wafer needs to be highly accurate. Further, one of major factors that decrease the yield of the LSI manufacturing is due to pattern defects on a mask for exposing/transferring an ultrafine pattern onto the semiconductor wafer by the photolithography technology. Therefore, the pattern inspection apparatus for inspecting defects on an exposure transfer mask used in manufacturing LSI also needs to be highly accurate.

The inspection apparatus acquires a pattern image by, for example, irradiating an inspection target substrate with multiple electron beams and detecting a secondary electron corresponding to each beam emitted from the inspection target substrate. As an inspection method, there is known a method of comparing a measured image acquired by imaging a pattern formed on a substrate with design data or with another measured image acquired by imaging an identical pattern on the same substrate. For example, as a pattern inspection method, there is "die-to-die inspection" or "die-to-database inspection". Specifically, the "die-to-die inspection" method compares data of measured images acquired by imaging identical patterns at different positions on the same substrate. The "die-to-database inspection" method generates, based on pattern design data, design image data (reference image), and compares it with a measured image being measured data acquired by imaging a pattern. Acquired images are transmitted as measured data to a comparison circuit. After performing alignment between the images, the comparison circuit compares the measured data with reference data according to an appropriate algorithm, and determines that there is a pattern defect if the compared data do not match each other.

When acquiring images by using multiple beams, scanning is performed in a predetermined range with multiple primary electron beams. Therefore, the emission position of each secondary electron beam changes every second. In order to apply each secondary electron beam whose emission position has changed to a corresponding detection region of a multi-detector, deflection needs to be performed to swing back (return) a movement of the position of the multiple secondary electron beams caused by the change of the emission position.

Although not relating to multiple beams, in an electron microscope, a target object is scanned with an electron beams, and after the electron beam which has passed through the target object is swung back by a swing-back coil, it is detected by a detector. There is disclosed that the amount of swing back by a swing-back coil can be calculated based on a change amount of an image acquired in advance by another camera different from the detector (refer to, e.g., Japanese Patent Application Laid-open (JP-A) No. 2006-196236). However, this method has a problem in that an image acquiring element of high resolution different from the detector which acquires images is needed. Therefore, two types of detectors need to be installed, which leads to large size and high cost of the apparatus. Moreover, a case may occur where the adjustment accuracy is insufficient.

BRIEF SUMMARY OF THE INVENTION

According to one aspect of the present invention, a multiple electron beam image acquisition method includes applying a representative primary electron beam selected from multiple primary electron beams to a plurality of positions in a primary electron beam deflection range of the representative primary electron beam having been preset above a stage on which a substrate is placed;

performing scanning with a representative secondary electron beam emitted from a position concerned due to the applying of the representative primary electron beam, based on temporary secondary electron beam deflection conditions, for each of the plurality of positions in the primary electron beam deflection range of the representative primary electron beam;

detecting the representative secondary electron beam with which the scanning has been performed based on the temporary secondary electron beam deflection conditions, for the each of the plurality of positions in the primary electron beam deflection range of the representative primary electron beam, by a predetermined detection element of a multi-detector including a plurality of detection elements;

acquiring a plurality of coordinates corresponding to the plurality of positions, based on detected images of the representative secondary electron beam each of which has been detected at any one of the plurality of positions in the primary electron beam deflection range of the representative primary electron beam;

calculating, using the plurality of coordinates acquired, secondary electron beam deflection conditions such that a movement of the representative secondary electron beam due to a movement of the representative primary electron beam in the primary electron beam deflection range of the representative primary electron beam is canceled and an irradiation position of the representative secondary electron beam to the predetermined detection element is fixed; and acquiring a secondary electron image of the substrate by detecting multiple secondary electron beams by the multi-detector while performing scanning with the multiple primary electron beams over a primary electron beam deflection range of the multiple primary electron beams on the substrate placed on the stage, and performing scanning with the multiple secondary electron beams emitted from the substrate due to beam deflection based on calculated secondary electron beam deflection conditions.

According to another aspect of the present invention, a multiple electron beam image acquisition apparatus includes a stage configured to place a substrate thereon;

a primary deflector configured to apply a representative primary electron beam selected from multiple primary electron beams to a plurality of positions in a primary electron beam deflection range of the representative primary electron beam having been preset above the stage;

a secondary deflector configured to perform scanning with a representative secondary electron beam emitted from a position concerned due to application of the representative primary electron beam, based on temporary secondary electron beam deflection conditions, for each of the plurality of positions in the primary electron beam deflection range of the representative primary electron beam;

a multi-detector configured to include a plurality of detection elements and to detect the representative secondary electron beam with which the scanning has been performed based on the temporary secondary electron beam deflection conditions, for the each of the plurality of positions in the primary electron beam deflection range of the representative primary electron beam, by a predetermined detection element of the plurality of detection elements;

a coordinate acquisition circuit configured to acquire a plurality of coordinates corresponding to the plurality of positions, based on detected images of the representative secondary electron beam each of which has been detected at any one of the plurality of positions in the primary electron beam deflection range of the representative primary electron beam; and a deflection condition calculation circuit configured to calculate, using the plurality of coordinates acquired, secondary electron beam deflection conditions such that a movement of the representative secondary electron beam due to a movement of the representative primary electron beam in the primary electron beam deflection range of the representative primary electron beam is canceled and an irradiation position of the representative secondary electron beam to the predetermined detection element is fixed, wherein a secondary electron image of the substrate is acquired by detecting multiple secondary electron beams by the multi-detector while the primary deflector performs scanning with the multiple primary electron beams over a primary electron beam deflection range of the primary electron beam on the substrate placed on the stage, and the secondary deflector performs scanning with the multiple secondary electron beams emitted from the substrate due to beam deflection based on calculated secondary electron beam deflection conditions.

According to yet another aspect of the present invention, a multiple electron beam inspection apparatus includes a stage configured to place a substrate thereon;

a primary deflector configured to apply a representative primary electron beam selected from multiple primary electron beams to a plurality of positions in a primary electron beam deflection range of the representative primary electron beam having been preset above the stage;

a secondary deflector configured to perform scanning with a representative secondary electron beam emitted from a position concerned due to application of the representative primary electron beam, based on temporary secondary electron beam deflection conditions, for each of the plurality of positions in the primary electron beam deflection range of the representative primary electron beam;

a multi-detector configured to include a plurality of detection elements and to detect the representative secondary electron beam with which the scanning has been performed based on the temporary secondary electron beam deflection conditions, for the each of the plurality of positions in the primary electron beam deflection range of the representative primary electron beam, by a predetermined detection element of the plurality of detection elements;

a coordinate acquisition circuit configured to acquire a plurality of coordinates corresponding to the plurality of positions, based on detected images of the representative secondary electron beam each of which has been detected at any one of the plurality of positions in the primary electron beam deflection range of the representative primary electron beam; and a deflection condition calculation circuit configured to calculate, using the plurality of coordinates acquired, secondary electron beam deflection conditions such that a movement of the representative secondary electron beam due to a movement of the representative primary electron beam in the primary electron beam deflection range of the representative primary electron beam is canceled and an irradiation position of the representative secondary electron beam to the predetermined detection element is fixed, wherein a secondary electron image of the substrate is acquired by detecting multiple secondary electron beams by the multi-detector while the primary deflector performs scanning with the multiple primary electron beams over a primary electron beam deflection range of the multiple primary electron beams on the substrate placed on the stage, and the secondary deflector performs scanning with the multiple secondary electron beams emitted from the substrate due to beam deflection based on calculated secondary electron beam deflection conditions, and further includes a comparison circuit configured to compare at least a portion of the secondary electron image acquired with a predetermined image.

According to yet another aspect of the present invention, a multiple electron beam image acquisition apparatus includes a stage configured to place a substrate thereon;

a primary deflector configured to apply a representative primary electron beam which represents multiple primary electron beams to a plurality of positions in a primary electron beam deflection range of the representative primary electron beam having been preset above the stage in order while shifting a time of applying the representative primary electron beam;

a secondary deflector configured to perform scanning with a representative secondary electron beam emitted from a position concerned due to application of the representative primary electron beam, based on temporary secondary electron beam deflection conditions, for each of the plurality of positions in the primary electron beam deflection range of the representative primary electron beam;

a multi-detector configured to include a plurality of detection elements and to detect the representative secondary electron beam with which the scanning has been performed based on the temporary secondary electron beam deflection conditions, for the each of the plurality of positions in the primary electron beam deflection range of the representative primary electron beam, by a predetermined detection element of the plurality of detection elements;

an image synthesis circuit configured to synthesize detected images of the representative secondary electron beam, each of which has been detected at any one of the plurality of positions in the primary electron beam deflection range of the representative primary electron beam; and a deflection condition calculation circuit configured to calculate, using a synthesized image, secondary electron beam deflection conditions such that a movement of the representative secondary electron beam due to a movement of the representative primary electron beam in the primary electron beam deflection range of the representative primary electron beam is canceled and an irradiation position of the representative secondary electron beam to the predetermined detection element is fixed, wherein a secondary electron image of the substrate is acquired by detecting multiple secondary electron beams by the multi-detector while the primary deflector performs scanning with the multiple primary electron beams over a primary electron beam deflection range of the multiple primary electron beams on the substrate placed on the stage, and the secondary deflector performs scanning with the multiple secondary electron beams emitted from the substrate due to beam deflection based on calculated secondary electron beam deflection conditions.

According to yet another aspect of the present invention, a multiple electron beam inspection apparatus includes a stage configured to place a substrate thereon;

a primary deflector configured to apply a representative primary electron beam which represents multiple primary electron beams to a plurality of positions in a primary electron beam deflection range of the representative primary electron beam having been preset above the stage in order while shifting a time of applying the representative primary electron beam;

a secondary deflector configured to perform scanning with a representative secondary electron beam emitted from a position concerned due to application of the representative primary electron beam, based on temporary secondary electron beam deflection conditions, for each of the plurality of positions in the primary electron beam deflection range of the representative primary electron beam;

a multi-detector configured to include a plurality of detection elements and to detect the representative secondary electron beam with which the scanning has been performed based on the temporary secondary electron beam deflection conditions, for the each of the plurality of positions in the primary electron beam deflection range of the representative primary electron beam, by a predetermined detection element of the plurality of detection elements;

an image synthesis circuit configured to synthesize detected images of the representative secondary electron beam, each of which has been detected at any one of the plurality of positions in the primary electron beam deflection range of the representative primary electron beam; and a deflection condition calculation circuit configured to calculate, using a synthesized image, secondary electron beam deflection conditions such that a movement of the representative secondary electron beam due to a movement of the representative primary electron beam in the primary electron beam deflection range of the representative primary electron beam is canceled and an irradiation position of the representative secondary electron beam to the predetermined detection element is fixed, wherein a secondary electron image of the substrate is acquired by detecting multiple secondary electron beams by the multi-detector while the primary deflector performs scanning with the multiple primary electron beams over a primary electron beam deflection range of the multiple primary electron beams on the substrate placed on the stage, and the secondary deflector performs scanning with the multiple secondary electron beams emitted from the substrate due to beam deflection based on calculated secondary electron beam deflection conditions, and further includes a comparison circuit configured to compare at least a portion of the secondary electron image acquired with a predetermined image.

BRIEF DESCRIPTION OF THE DRAWINGS

FIGS. 8A to 8C are diagrams illustrating the position of a representative secondary electron beam when the scanning center of a scanning range of a primary electron beam is irradiated with a representative primary electron beam according to the first embodiment;

DETAILED DESCRIPTION OF THE INVENTION

Embodiments of the present invention provide an apparatus and method that can acquire images with respect to which deflection adjustment of multiple secondary electron beams has been performed for canceling the position movement of the multiple secondary electron beams resulting from scanning with multiple primary electron beams, without using another measurement means different from the detector for acquiring the images. The embodiments below describe an inspection apparatus using multiple electron beams, as an example of a multiple electron beam image acquisition apparatus. However, it is not limited thereto. Any apparatus can be used as long as it acquires images by irradiating a substrate with multiple primary electron beams in order to use multiple secondary electron beams emitted from the substrate due to the irradiation.

First Embodiment

Figure 1:
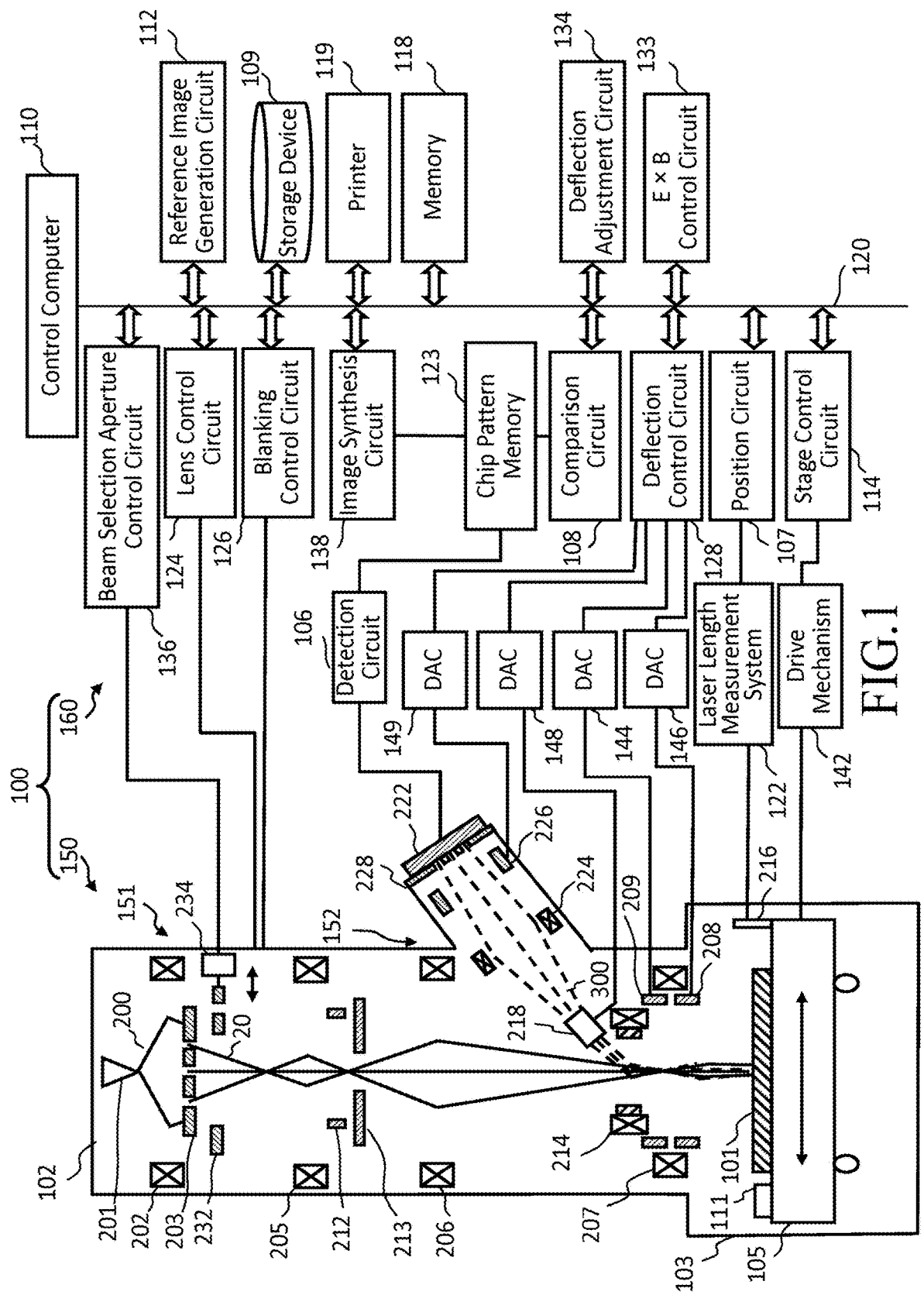
FIG. 1 is a diagram showing a configuration of an inspection apparatus according to a first embodiment.

FIG. 1 is a diagram showing an example of a configuration of an inspection apparatus according to a first embodiment. In FIG. 1, an inspection apparatus 100 for inspecting a pattern formed on the substrate is an example of a multi-electron beam inspection apparatus. The inspection apparatus 100 includes an image acquisition mechanism 150 and a control system circuit 160. The image acquisition mechanism 150 includes an electron beam column 102 (electron optical column) and an inspection chamber 103. In the electron beam column 102, there are disposed an electron gun 201, an electromagnetic lens 202, a shaping aperture array substrate 203, a beam selection aperture substrate 232, a drive mechanism 234, an electromagnetic lens 205, a bundle blanking deflector 212, a limiting aperture substrate 213, an electromagnetic lens 206, an electromagnetic lens 207 (objective lens), a main deflector 208, a sub deflector 209, an ExB separator 214 (beam separator), a deflector 218, an electromagnetic lens 224, a deflector 226, a detector aperture array substrate 228, and a multi-detector 222. A primary electron optical system 151 (illumination optical system) is composed of the electron gun 201, the electromagnetic lens 202, the shaping aperture array substrate 203, the electromagnetic lens 205, the bundle blanking deflector 212, the limiting aperture substrate 213, the beam selection aperture substrate 232, the electromagnetic lens 206, the electromagnetic lens 207 (objective lens), the main deflector 208, and the sub deflector 209. A secondary electron optical system 152 (detecting optical system) is composed of the electromagnetic lens 207, the ExB separator 214, the deflector 218, the electromagnetic lens 224, and the deflector 226.

In the inspection chamber 103, there is disposed a stage 105 movable at least in the x and y directions. On the stage 105, a substrate 101 (target object) to be inspected is placed. The substrate 101 may be an exposure mask substrate, or a semiconductor substrate such as a silicon wafer. In the case of the substrate 101 being a semiconductor substrate, a plurality of chip patterns (wafer dies) are formed on the semiconductor substrate. In the case of the substrate 101 being an exposure mask substrate, a chip pattern is formed on the exposure mask substrate. The chip pattern is composed of a plurality of figure patterns. By exposing/transferring a chip pattern formed on the exposure mask substrate onto the semiconductor substrate a plurality of times, a plurality of chip patterns (wafer dies) are formed on the semiconductor substrate. The case of the substrate 101 being a semiconductor substrate is mainly described below. The substrate 101 is placed, with its pattern-forming surface facing upward, on the stage 105, for example. Further, on the stage 105, there is disposed a mirror 216 which reflects a laser beam for measuring a laser length emitted from a laser length measuring system 122 arranged outside the inspection chamber 103. Furthermore, on the XY stage 105, a mark 111 adjusted to be flush in height with the surface of the substrate 101 is arranged. For example, a cross pattern is formed as the mark 111.

The multi-detector 222 is connected, at the outside of the electron beam column 102, to a detection circuit 106. The detection circuit 106 is connected to a chip pattern memory 123.

The multi-detector 222 includes a plurality of detection elements arranged in an array. In the detector aperture array substrate 228, a plurality of openings are formed at the array pitch of the plurality of detection elements. Each of the plurality of openings is a circle, for example. The center position of each opening is formed to correspond to the center position of a corresponding detection element. The size of the opening is smaller than that of the electron detection surface region of the detection element. The detector aperture array substrate 228 may be integrated as a partial configuration of the multi-detector 222.

In the control system circuit 160, a control computer 110 which controls the whole of the inspection apparatus 100 is connected, through a bus 120, to a position circuit 107, a comparison circuit 108, a reference image generation circuit 112, a stage control circuit 114, a lens control circuit 124, a blanking control circuit 126, a deflection control circuit 128, an ExB control circuit 133, a deflection adjustment circuit 134, a beam selection aperture control circuit 136, an image synthesis circuit 138, a storage device 109 such as a magnetic disk drive, a memory 118, and a printer 119. The deflection control circuit 128 is connected to DAC (digital-to-analog conversion) amplifiers 144, 146, 148 and 149. The DAC amplifier 146 is connected to the main deflector 208, the DAC amplifier 144 is connected to the sub deflector 209, the DAC amplifier 148 is connected to the deflector 218, and the DAC amplifier 149 is connected to the deflector 226.

The chip pattern memory 123 is connected to the comparison circuit 108 and the image synthesis circuit 138. The stage 105 is driven by a drive mechanism 142 under the control of the stage control circuit 114. In the drive mechanism 142, for example, a drive system such as a three (x-, y-, and θ-) axis motor which provides drive in the directions of x, y, and θ in the stage coordinate system is configured, and thus the stage 105 can move in the x, y, and θ directions. A step motor, for example, can be used as each of these x, y, and θ motors (not shown). The stage 105 is movable in the horizontal direction and the rotation direction by the x-, y-, and θ-axis motors. The movement position of the stage 105 is measured by the laser length measuring system 122, and supplied (transmitted) to the position circuit 107. Based on the principle of laser interferometry, the laser length measuring system 122 measures the position of the stage 105 by receiving a reflected light from the mirror 216. With respect to the stage coordinate system, the x, y, and θ directions of the primary coordinate system are set, for example, to a plane perpendicular to the optical axis of multiple primary electron beams 20.

The electromagnetic lenses 202, 205, 206, 207, and 224 are controlled by the lens control circuit 124. The E×B separator 214 is controlled by the E×B control circuit 133. The bundle blanking deflector 212 is an electrostatic deflector composed of two or more electrodes (or poles), and each electrode is controlled by the blanking control circuit 126 through a DAC amplifier (not shown). The sub deflector 209 is an electrostatic deflector composed of four or more electrodes (or poles), and each electrode is controlled by the deflection control circuit 128 through the DAC amplifier 144. The main deflector 208 is an electrostatic deflector composed of four or more electrodes (or poles), and each electrode is controlled by the deflection control circuit 128 through the DAC amplifier 146. The deflector 218 is an electrostatic deflector composed of four or more electrodes (or poles), and each electrode is controlled by the deflection control circuit 128 through the DAC amplifier 148. The deflector 226 is an electrostatic deflector composed of four or more electrodes (or poles), and each electrode is controlled by the deflection control circuit 128 through the DAC amplifier 149.

The beam selection aperture substrate 232 is driven by the drive mechanism 234 which is controlled by the beam selection aperture control circuit 136.

To the electron gun 201, there is connected a high voltage power supply circuit (not shown). The high voltage power supply circuit applies an acceleration voltage between a filament (cathode) and an extraction electrode (anode) (which are not shown) in the electron gun 201. In addition to the applying the acceleration voltage, a voltage is applied to another extraction electrode (Wehnelt), and the cathode is heated to a predetermined temperature, and thereby, electrons from the cathode are accelerated to be emitted as an electron beam 200.

FIG. 1 shows configuration elements necessary for describing the first embodiment. Other configuration elements generally necessary for the inspection apparatus 100 may also be included therein.

Figure 2:
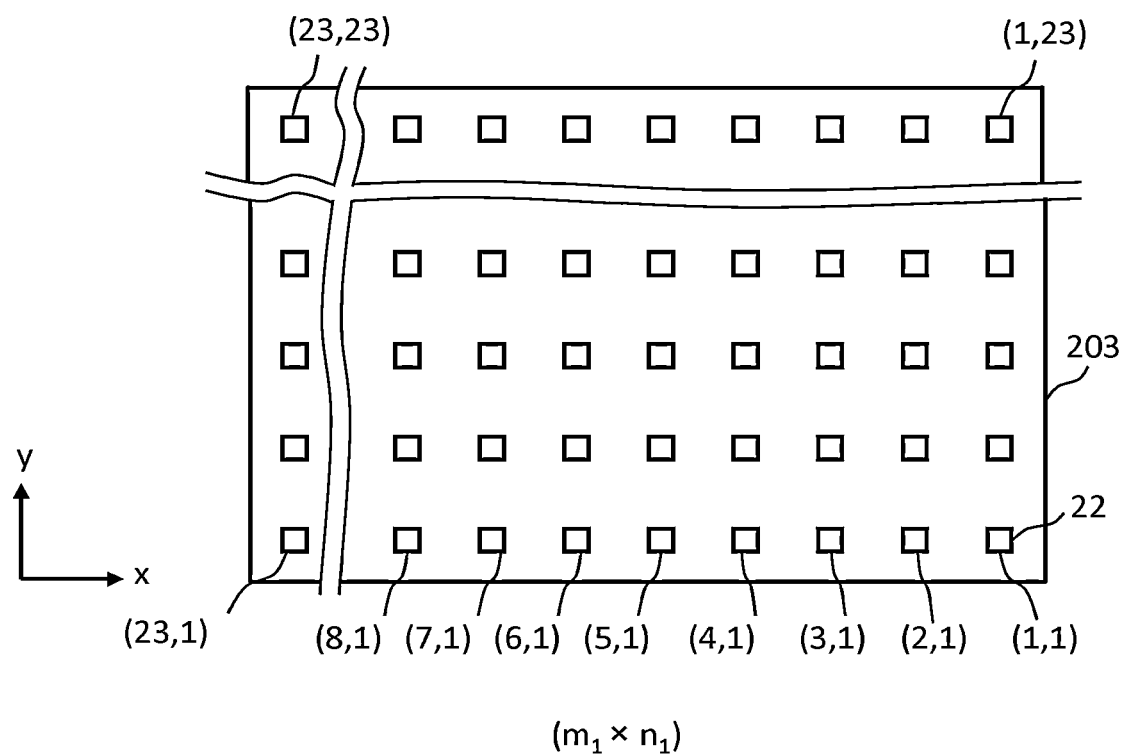
FIG. 2 is a conceptual diagram showing a configuration of a shaping aperture array substrate according to the first embodiment.

FIG. 2 is a conceptual diagram showing a configuration of a shaping aperture array substrate according to the first embodiment. As shown in FIG. 2, holes (openings) 22 of $m_1$ columns wide (width in the x direction) and $n_1$ rows long (length in the y direction), where each of $m_1$ and $n_1$ is an integer of 2 or more, are two-dimensionally formed in the x and y directions at a predetermined arrangement pitch in the shaping aperture array substrate 203. In the case of FIG. 2, 23×23 holes (openings) 22 are formed. Each of the holes 22 is a rectangle (including a square) having the same dimension, shape, and size. Alternatively, each of the holes 22 may be a circle with the same outer diameter. The multiple primary electron beams 20 are formed by letting portions of the electron beam 200 individually pass through a corresponding one of the plurality of holes 22. Next, operations of the image acquisition mechanism 150 when acquiring a secondary electron image will be described below. In the primary electron optical system 151, the multiple primary electron beams 20 irradiate the substrate 101. Specifically, it operates as follows:

The electron beam 200 emitted from the electron gun 201 (emission source) is refracted by the electromagnetic lens 202, and illuminates the whole of the shaping aperture array substrate 203. As shown in FIG. 2, a plurality of holes (openings) are formed in the shaping aperture array substrate 203. The region including all the plurality of holes 22 is irradiated by the electron beam 200. The multiple primary electron beams 20 are formed by letting portions of the electron beam 200, which irradiate the positions of the plurality of holes 22, individually pass through a corresponding one of the plurality of holes 22 in the shaping aperture array substrate 203.

The formed multiple primary electron beams 20 are individually refracted by the electromagnetic lenses 205 and 206, and travel to the electromagnetic lens 207 (objective lens), while repeating forming an intermediate image and a crossover, passing through the E×B separator 214 arranged on the intermediate image plane of each beam of the multiple primary electron beams 20.

When the multiple primary electron beams 20 are incident on the electromagnetic lens 207 (objective lens), the electromagnetic lens 207 focuses the multiple primary electron beams 20 onto the substrate 101. The multiple primary electron beams 20 having been focused on the substrate 101 (target object) by the electromagnetic lens 207 are collectively deflected by the main deflector 208 and the sub deflector 209 to irradiate respective beam irradiation positions on the substrate 101. In the case where all of the multiple primary electron beams 20 are collectively deflected by the bundle blanking deflector 212, they deviate from the hole in the center of the limiting aperture substrate 213 and are blocked by the limiting aperture substrate 213. On the other hand, the multiple primary electron beams 20 which were not deflected by the bundle blanking deflector 212 pass through the hole in the center of the limiting aperture substrate 213 as shown in FIG. 1. Blanking control is provided by On/Off of the bundle blanking deflector 212, and thus On/Off of the multiple beams is collectively controlled. In this way, the limiting aperture substrate 213 blocks the multiple primary electron beams 20 which were deflected to be in an "Off condition" by the bundle blanking deflector 212. Then, the multiple primary electron beams 20 for image acquisition are formed by the beams having been made during a period from becoming "beam On" to becoming "beam Off" and having passed through the limiting aperture substrate 213.

When desired positions on the substrate 101 are irradiated with the multiple primary electron beams 20, a flux of secondary electrons (multiple secondary electron beams 300) including reflected electrons, each corresponding to each of the multiple primary electron beams 20, is emitted from the substrate 101 due to the irradiation with the multiple primary electron beams 20.

The multiple secondary electron beams 300 emitted from the substrate 101 travel to the E×B separator 214 through the electromagnetic lens 207. The E×B separator 214 includes a plurality of, at least two, magnetic poles each having a coil, and a plurality of, at least two, electrodes (poles). For example, the E×B separator 214 includes four magnetic poles (magnetic deflection coils) whose phases are mutually shifted by 90°, and four electrodes (electrostatic deflection electrodes) whose phases are also mutually shifted by 90°. For example, by setting opposing two magnetic poles to be an N pole and an S pole, a directive magnetic field is generated by the plurality of magnetic poles. Also, for example, by applying electrical potentials V whose signs are opposite to each other to two opposing electrodes, a directive electric field is generated by the plurality of electrodes. Specifically, the E×B separator 214 generates an electric field and a magnetic field to be perpendicular to each other in a plane orthogonal to the traveling direction of the center beam (i.e., trajectory center axis) of the multiple primary electron beams 20. The electric field exerts a force in a fixed direction regardless of the traveling direction of electrons. In contrast, the magnetic field exerts a force according to Fleming's left-hand rule. Therefore, the direction of force acting on electrons can be changed depending on the entering (or "traveling") direction of electrons. With respect to the multiple primary electron beams 20 entering the E×B separator 214 from above, since the forces due to the electric field and the magnetic field cancel each other out, the beams 20 travel straight downward. In contrast, with respect to the multiple secondary electron beams 300 entering the E×B separator 214 from below, since both the forces due to the electric field and the magnetic field are exerted in the same direction, the beams 300 are bent obliquely upward, and separated from the trajectory of the multiple primary electron beams 20.

The multiple secondary electron beams 300 having been bent obliquely upward are further bent by the deflector 218, and projected onto the multi-detector 222 while being refracted by the electromagnetic lens 224. The multi-detector 222 detects the projected multiple secondary electron beams 300 having passed through the openings in the detector aperture array substrate 228. At the detection surface of the multi-detector 222, since each beam of the multiple primary electron beams 20 collides with a detection element corresponding to each secondary electron beam of the multiple secondary electron beams 300, electrons are amplified and generated, and secondary electron image data is generated for each pixel. An intensity signal detected by the multi-detector 222 is output to the detection circuit 106. A sub-irradiation region on the substrate 101, which is surrounded by the beam pitch in the x direction and the beam pitch in the y direction and in which the beam concerned itself is located, is irradiated with each primary electron beam, and the inside of the sub-irradiation region is scanned with each primary electron beam.

Figure 3:
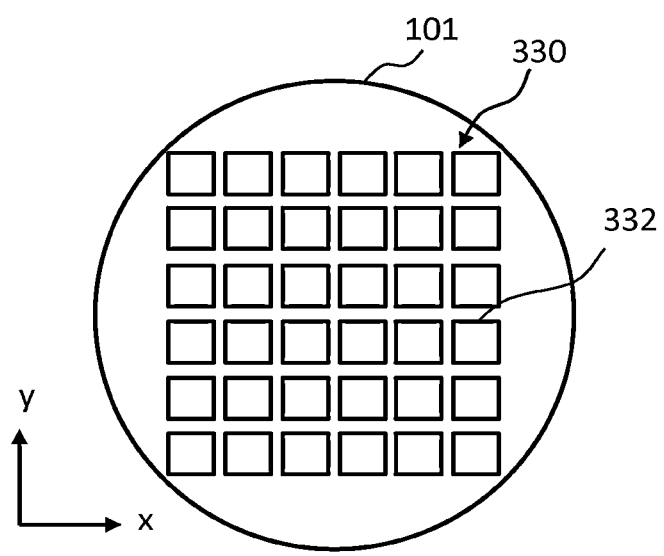
FIG. 3 is an example showing a plurality of chip regions formed on a semiconductor substrate, according to the first embodiment.
Figure 3:
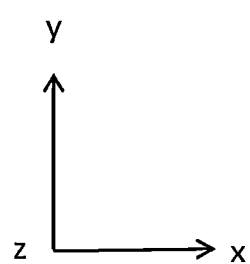

FIG. 3 is an example showing a plurality of chip regions formed on a semiconductor substrate, according to the first embodiment. In FIG. 3, in the case of the substrate 101 being a semiconductor substrate (wafer), a plurality of chips (wafer dies) 332 are formed in a two-dimensional array in an inspection region 330 of the semiconductor substrate (wafer). With respect to each chip 332, a mask pattern for one chip formed on an exposure mask substrate is reduced to, for example, ¼, and exposed/transferred onto each chip 332 by an exposure device such as a stepper (not shown). A mask pattern for one chip is generally composed of a plurality of figure patterns.

Figure 4:
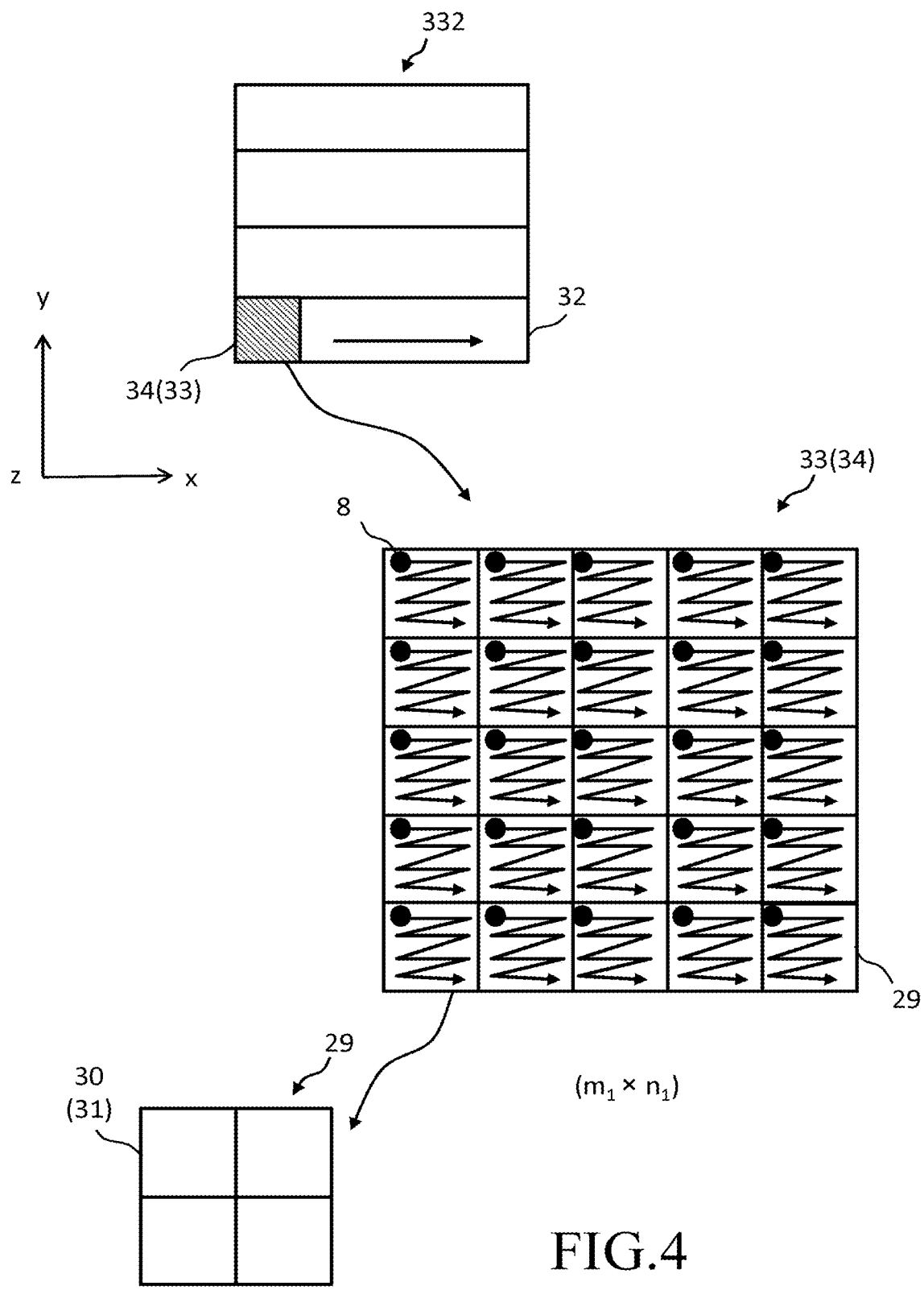
FIG. 4 is an illustration describing inspection processing according to the first embodiment.

FIG. 4 is an illustration describing inspection processing according to the first embodiment. As shown in FIG. 4, the region of each chip 332 is, for example, divided in the y direction into a plurality of stripe regions 32 by a predetermined width. The scanning operation by the image acquisition mechanism 150 is carried out for each stripe region 32, for example. The operation of scanning the stripe region 32 advances relatively in the x direction while the stage 105 is moved in the −x direction, for example. Each stripe region 32 is divided in the longitudinal direction into a plurality of rectangular (including square) regions 33. Beam application to a target rectangular region 33 is achieved by collectively deflecting all the multiple primary electron beams 20 by the main deflector 208.

The case of FIG. 4 shows the multiple primary electron beams 20 of 5 rows×5 columns, for example. The size of an irradiation region 34 which can be irradiated by one irradiation with the multiple primary electron beams 20 is defined by (x direction size obtained by multiplying an x-direction beam pitch of the multiple primary electron beams 20 on the substrate 101 by the number of beams in the x direction)×(y direction size obtained by multiplying a y-direction beam pitch of the multiple primary electron beams 20 on the substrate 101 by the number of beams in the y direction). The irradiation region 34 serves as a field of view of the multiple primary electron beams 20. The inside of a sub-irradiation region 29 is irradiated and scanned with each primary electron beam 8 of the multiple primary electron beams 20, where the sub-irradiation region 29 is surrounded by the beam pitch in the x direction and the beam pitch in the y direction and the beam concerned itself is located therein. Each primary electron beam 8 is associated with any one of the sub-irradiation regions 29 which are different from each other. At the time of each shot, each primary electron beam 8 is applied to the same position in the associated sub-irradiation region 29. The primary electron beam 8 is moved in the sub-irradiation region 29 by collective deflection of all the multiple primary electron beams 20 by the sub deflector 209. By repeating this operation, the inside of one sub-irradiation region 29 is irradiated, in order, with one primary electron beam 8.

Preferably, the width of each stripe region 32 is set to be the same as the size in the y direction of the irradiation region 34, or to be the size reduced by the width of the scanning margin. In the case of FIG. 4, the irradiation region 34 and the rectangular region 33 are of the same size. However, it is not limited thereto. The irradiation region 34 may be smaller than the rectangular region 33, or larger than it. The sub-irradiation region 29, where the beam concerned itself is located, is irradiated and scanned with each primary electron beam 8 of which the multiple primary electron beams 20 is composed, by collective deflection of all the multiple primary electron beams 20 by the sub deflector 209. Then, when scanning of one sub-irradiation region 29 is completed, the irradiation position is moved to an adjacent rectangular region 33 in the same stripe region 32 by collectively deflecting all of the multiple primary electron beams 20 by the main deflector 208. By repeating this operation, the inside of the stripe region 32 is irradiated in order. After completing scanning of one stripe region 32, the irradiation region 34 is moved to the next stripe region 32 by moving the stage 105 and/or by collectively deflecting all of the multiple primary electron beams 20 by the main deflector 208. As described above, by irradiation with each primary electron beam 8, the scanning operation per sub-irradiation region 29 and acquisition of a secondary electron image are performed. By combining secondary electron images of respective sub-irradiation regions 29, a secondary electron image of the rectangular region 33, a secondary electron image of the stripe region 32, or a secondary electron image of the chip 332 is configured. When an image comparison is actually performed, the sub-irradiation region 29 in each rectangular region 33 is further divided into a plurality of frame regions 30, and a frame image 31 of each frame region 30 is compared. FIG. 4 shows the case of dividing the sub-irradiation region 29 which is scanned with one primary electron beam 8 into four frame regions 30 by halving it in the x and y directions.

As described above, the image acquisition mechanism 150 proceeds with a scanning operation per stripe region 32. The multiple secondary electron beams 300 emitted from the substrate 101 due to irradiation with the multiple primary electron beams 20 are detected by the multi-detector 222. A reflected electron may be included in the detected multiple secondary electron beams 300. Alternatively, a reflected electron may be separated during moving in the secondary electron optical system 152 and therefore may not reach the multi-detector 222. Detection data (measured image data: secondary electron image data: inspection image data) on the secondary electron of each pixel in each sub-irradiation region 29, detected by the multi-detector 222, is output to the detection circuit 106 in order of measurement. In the detection circuit 106, the detected data in analog form is converted into digital data by an A-D converter (not shown), and stored in the chip pattern memory 123. Then, acquired measured image data is transmitted to the comparison circuit 108, together with information on each position from the position circuit 107.

Since the inside of the sub irradiation region 29 is scanned with the multiple primary electron beams 20, the emission position of each secondary electron beam changes every second in the sub irradiation region 29. Therefore, if left as is, each secondary electron beam is projected onto a position deviated from a corresponding detection element of the multi-detector 222. Then, it is necessary that the deflector 226 collectively deflects the multiple secondary electron beams 300 so that each secondary electron beam whose emission position has changed as described above may irradiate a corresponding detection region of the multi-detector 222. In order to make each secondary electron beam irradiate a corresponding detection region of the multi-detector 222, deflection for swinging back (canceling) a movement of the position of the multiple secondary electron beams caused by the change of the emission position needs to be performed. Thus, it becomes necessary to match the deflection range (scanning range) of each primary electron beam of the multiple primary electron beams 20 with the deflection range (scanning range) of each secondary electron beam of the multiple secondary electron beams 300.

Figure 5:
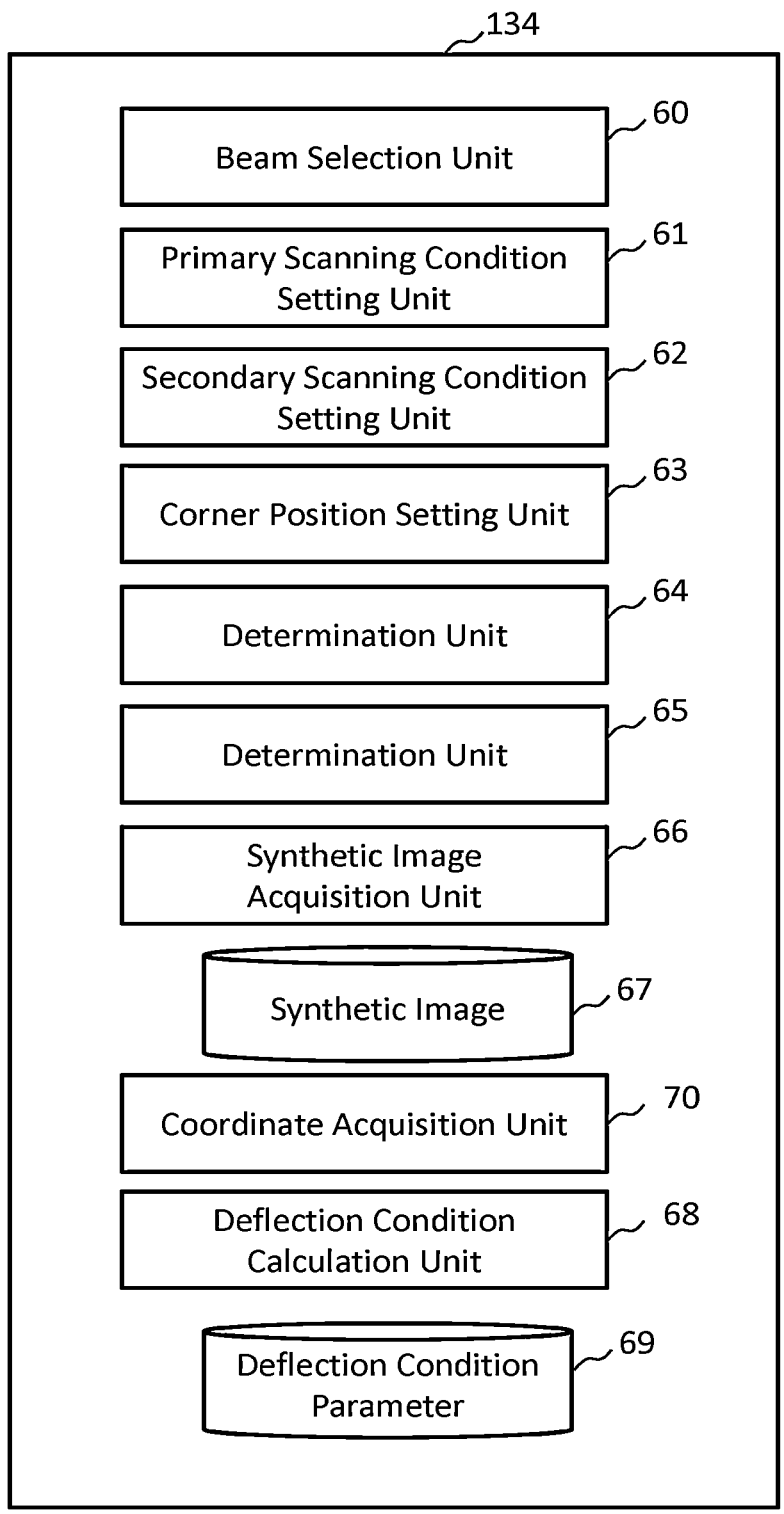
FIG. 5 is a diagram showing an example of an internal configuration of a deflection adjustment circuit according to the first embodiment.

FIG. 5 is a diagram showing an example of an internal configuration of a deflection adjustment circuit according to the first embodiment. In FIG. 5, in the deflection adjustment circuit 134, there are arranged storage devices 67 and 69 such as magnetic disk drives, a beam selection unit 60, a primary scanning condition setting unit 61, a secondary scanning condition setting unit 62, a corner position setting unit 63, a determination unit 64, a determination unit 65, a synthetic image acquisition unit 66, a coordinate acquisition unit 70, and a deflection condition calculation unit 68. Each of the "units" such as the beam selection unit 60, the primary scanning condition setting unit 61, the secondary scanning condition setting unit 62, the corner position setting unit 63, the determination unit 64, the determination unit 65, the synthetic image acquisition unit 66, the coordinate acquisition unit 70, and the deflection condition calculation unit 68 includes processing circuitry. The processing circuitry includes, for example, an electric circuit, a computer, a processor, a circuit board, a quantum circuit, a semiconductor device, or the like. Further, common processing circuitry (the same processing circuitry), or different processing circuitry (separate processing circuitry) may be used for each of the "units". Input data required in the beam selection unit 60, the primary scanning condition setting unit 61, the secondary scanning condition setting unit 62, the corner position setting unit 63, the determination unit 64, the determination unit 65, the synthetic image acquisition unit 66, the coordinate acquisition unit 70, and the deflection condition calculation unit 68, and calculated results are stored in a memory (not shown) or in the memory 118 each time.

Figure 6:
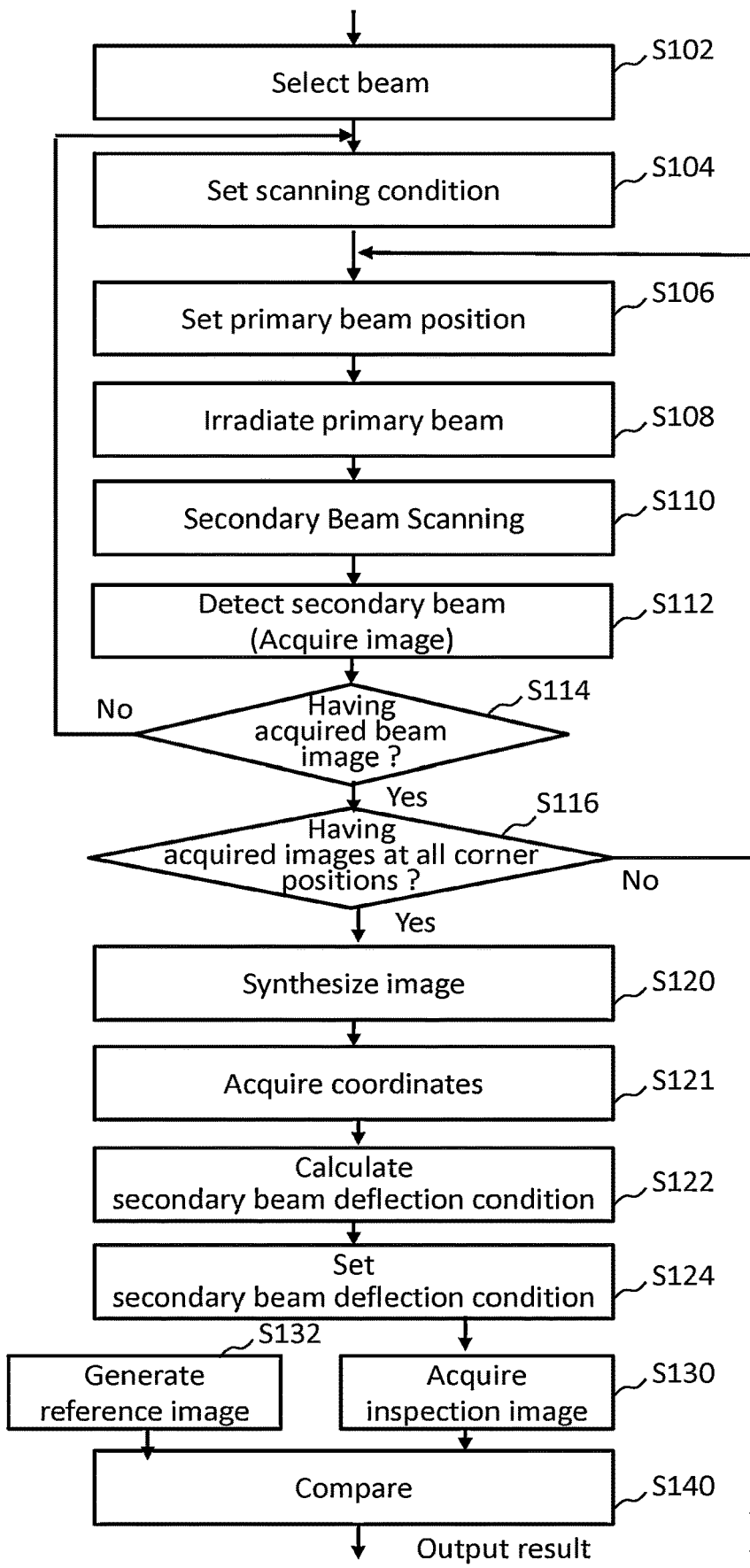
FIG. 6 is a flowchart showing an example of main steps of an inspection method according to the first embodiment.

FIG. 6 is a flowchart showing main steps of an inspection method according to the first embodiment. In FIG. 6, the main steps of the inspection method of the first embodiment executes a series of steps: a beam selection step (S102), a scanning condition setting step (S104), a primary beam position setting step (S106), a primary beam irradiation step (S108), a secondary beam scanning step (S110), a secondary beam detection (image acquisition) step (S112), a determination step (S114), a determination step (S116), an image synthesis step (S120), a coordinate acquisition step (S121), a secondary beam deflection condition calculation step (S122), a secondary beam deflection condition setting step (S124), an inspection image acquisition step (S130), a reference image generating step (S132), and a comparison step (S140).

In the beam selection step (S102), the beam selection unit 60 selects a representative primary electron beam 10 from the multiple primary electron beams 200. For example, the center beam of the multiple primary electron beams 200 is selected as the representative primary electron beam 10. The representative primary electron beam 10 is not limited to one beam. Two or more beams may be selected. When selecting two or more beams, irradiation is applied to each beam in order.

Figure 7:
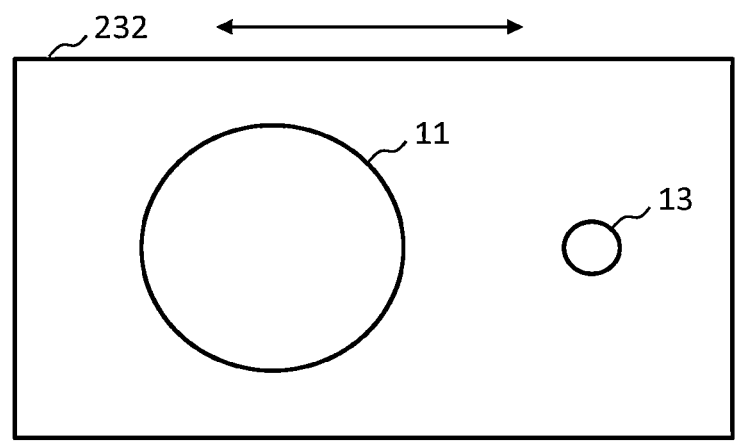
FIG. 7 is an illustration showing a method for selecting a beam according to the first embodiment.
Figure 7:
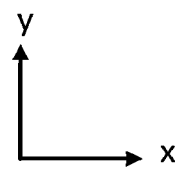

FIG. 7 is an illustration showing a method for selecting a beam according to the first embodiment. In FIG. 7, a small aperture 13 is formed to have a size through which one primary electron beam can pass. A large aperture 11 is formed to have a size through which all the multiple primary electron beams 20 can pass. Under the control of the beam selection aperture control circuit 136, the drive mechanism 234 selectively makes one primary electron beam pass through the small aperture 13 by fitting the position of the small aperture 13 with the trajectory of one primary electron beam of the multiple primary electron beams 20 by horizontally moving the beam selection aperture substrate 232. The other remaining beams are blocked by the beam selection aperture substrate 232.

In the scanning condition setting step (S104), the primary scanning condition setting unit 61 sets scanning conditions of the multiple primary electron beams 20. As the scanning conditions of the multiple primary electron beams 20, scan widths in the x and y directions are set. Here, widths in the x and y directions of the sub irradiation region 29 are set. Alternatively, margins may be added to the above widths. In addition, a relative angle to the mark 111 may be set.

The secondary scanning condition setting unit 62 sets temporary scanning conditions of the multiple secondary electron beams 300. Scan widths in the x and y directions are set as the temporary scanning conditions of the multiple secondary electron beams 300.

In order to match the deflection range (scanning range) of each primary electron beam of the multiple primary electron beams 20 with the deflection range (scanning range) of each secondary electron beam of the multiple secondary electron beams 300, positions of the four corners (four corner positions) of the scanning range of a primary electron beam are matched with positions of the four corners (four corner positions) of the scanning range of a corresponding secondary electron beam.

In the primary beam position setting step (S106), the corner position setting unit 63 sets one of the positions of the four corners of the scanning range of a primary electron beam. For example, the position of the lower left corner of the scanning range of the primary electron beam is set.

In the primary beam irradiation step (S108), the image acquisition mechanism 150 applies a representative primary electron beam onto the stage 105. At this time, the main deflector 208 aligns the center of the multiple primary electron beams with the position of the trajectory central axis of the multiple primary electron beams. If, without being deflected, the center of the multiple primary electron beams is located at the trajectory central axis of the multiple primary electron beams, it is acceptable not to provide deflection. Thereby, the scanning center position of the scanning range of each primary electron beam concerned is irradiated with each primary electron beam. Since beams other than a representative primary electron beam are here blocked by the beam selection aperture substrate 232, only the representative primary electron beam reaches the stage 105. At the irradiation position on the stage 105, a substrate for evaluation is disposed. Alternatively, the mark 111 may be disposed at the irradiation position. Alternatively, the upper surface of the stage 105 may be used as the irradiation position.

Figure 8A:
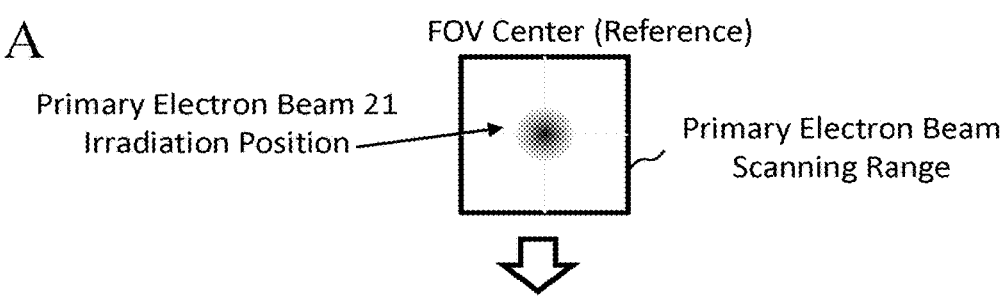
Figure 8B:
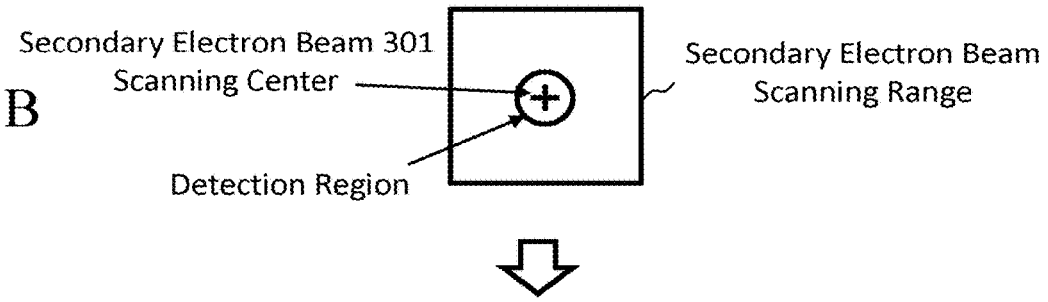
Figure 8B:
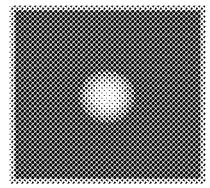
Figure 8B:
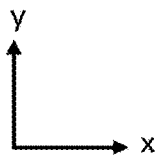

FIGS. 8A to 8C are diagrams illustrating the position of a representative secondary electron beam when the scanning center of a scanning range of a primary electron beam is irradiated with a representative primary electron beam according to the first embodiment. In FIG. 8A, when the scanning center of the scanning range is irradiated with a representative primary electron beam 21, a representative secondary electron beam 301 corresponding to the representative primary electron beam 21 is emitted from the stage 105. The representative secondary electron beam 301 is projected onto the multi-detector 222 through the detector aperture array substrate 228 by the secondary electron optical system 152. In this state, the deflector 226 performs scanning with the representative secondary electron beam 301 over the secondary beam scanning range which is currently set for the representative secondary electron beam 301. Thereby, a corresponding detection element acquires an aperture image of the detector aperture array substrate 228. If the representative primary electron beam 21 is the center beam of the multiple primary electron beams 20, the corresponding element is the center detection element of the multi-detector 222. When the scanning center of the scanning range of the primary electron beam concerned is irradiated with the representative primary electron beam 21, the scanning center of the scanning range of the representative secondary electron beam 301 is coincident with the center of the detection region of the detection element as shown in FIG. 8B. Therefore, as shown in FIG. 8C, the aperture image acquired by detection element is located at the center of the image.

Next, the sub deflector 209 (primary deflector) applies the representative primary electron beam 21 to a plurality of positions in a preset primary electron beam deflection range (scanning range) on the stage 105 in order while shifting the time of applying the beam. Here, the sub deflector 209 deflects the representative primary electron beam so that the lower left corner position of the preset scanning range of the primary electron beam may be irradiated with the representative primary electron beam.

Figures 9A, 9B, 9C:
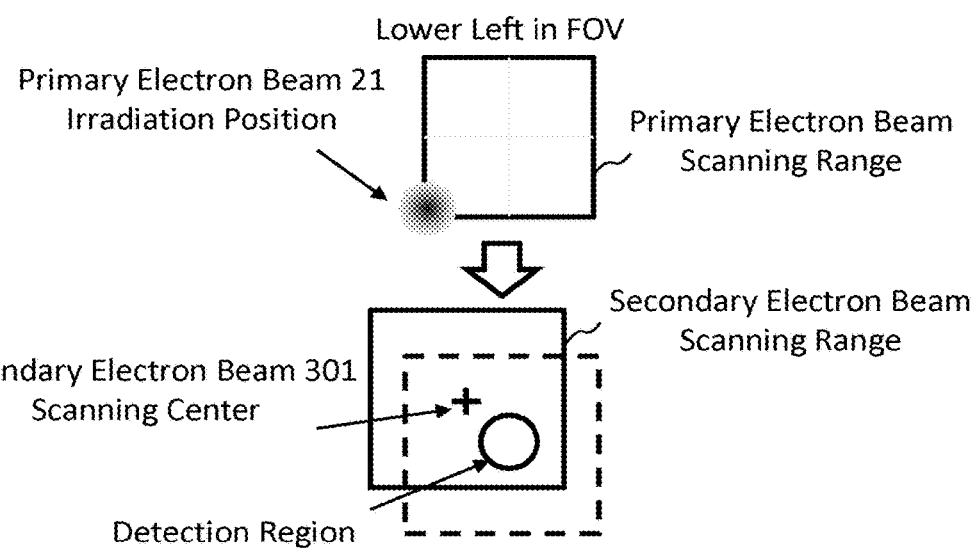
FIGS. 9A to 9C are diagrams illustrating an example of the position of a representative secondary electron beam when the lower left corner position of a scanning range of a primary electron beam is irradiated with a representative primary electron beam according to the first embodiment.

FIGS. 9A to 9C are diagrams illustrating an example of the position of the representative secondary electron beam 301 when the lower left corner position of the scanning range of a primary electron beam is irradiated with the representative primary electron beam 21 according to the first embodiment. As shown in FIG. 9A, the position of the lower left corner of the scanning range is irradiated with the representative primary electron beam 21 by beam deflection by the sub deflector 209.

In the secondary beam scanning step (S110), the deflector 226 (secondary deflector) performs scanning with the representative secondary electron beam 301 (or "deflects the representative secondary electron beam 301") emitted from the position concerned due to irradiation of the representative primary electron beam 21, based on temporary secondary beam deflection conditions, over each of a plurality of positions in the deflection range of a representative primary beam. Here, as the plurality of positions in the deflection range of the representative primary beam, the four corner positions are used as described above. Then, here, the lower left corner position of the deflection range of the representative primary beam is scanned with the representative secondary electron beam 301 by the deflector 226. The temporary secondary beam deflection conditions are temporary scanning conditions currently set for the multiple secondary electron beams 300.

In FIG. 9A, when the representative primary electron beam 21 irradiates the position of the lower left corner of the scanning range, the representative secondary electron beam 301 corresponding to the representative primary electron beam 21 is emitted from the stage 105. The representative secondary electron beam 301 is projected onto the multi-detector 222 through the detector aperture array substrate 228 by the secondary electron optical system 152. Since the scanning center has not been irradiated with the representative primary electron beam 21, the scanning center position of the representative secondary electron beam 301 deviates from the center of the detection region of a corresponding detection element. FIG. 9B shows the case where the scanning center position of the representative secondary electron beam 301 has shifted, for example, to the upper left of the detection region center of the detection element. In this state, the deflector 226 performs scanning with the representative secondary electron beam 301 over the secondary beam scanning range which is currently set for the representative secondary electron beam 301.

In the secondary beam detection (image acquisition) step (S112), a corresponding detection element (predetermined detection element) of the multi-detector 222 detects the representative secondary electron beam 301 with which scanning has been performed based on temporary secondary beam deflection conditions, for each of a plurality of positions in the deflection range of a representative primary beam. Here, with respect to the lower left corner position of the deflection range of the representative primary beam, the representative secondary electron beam 301 with which scanning has been performed is detected. When the position of the lower left corner of the scanning range is irradiated with the representative primary beam 21, a generated representative secondary beam reaches the upper left of a corresponding detection element. Then, only when passing over the opening of the detector aperture array substrate 228 by a scanning operation, the representative secondary electron beam 301 reaches a detection element and is detected by this detection element. Thereby, the corresponding detection element acquires an aperture image of the detector aperture array substrate 228. Since the detection region is located at the lower right of the scanning center of the representative secondary electron beam 301, the aperture image acquired by the detection element is located at the lower right of the center of the image as shown in FIG. 9C. The rectangular (including square) frame of the detected image shows a secondary beam scanning range. The detected image of the representative secondary electron beam 301 is output to the image synthesis circuit 138.

In the determination step (S114), the determination unit 64 determines whether an aperture image (secondary beam image) has been obtained. If an aperture image has not been obtained, it returns to the scanning condition setting step (S104) to change and reset the scanning conditions. For example, there is a case where a secondary electron beam does not pass over the opening of the detector aperture array substrate 228 because the secondary beam scanning range is too narrow. In that case, the scanning width is expanded. Then, steps from the scanning condition setting step (S104) to the determination step (S114) are repeated until an aperture image is obtained. When an aperture image has been acquired, it goes to the determination step (S116).

In the determination step (S116), the determination unit 65 determines whether acquiring aperture images at all the corner positions has been completed. When acquiring has been completed at all the corner positions, it goes to the image synthesis step (S120). If acquiring at all the corner positions has not been completed, it returns to the primary beam position setting step (S106), and steps from the primary beam position setting step (S106) to the determination step (S116) are repeated until acquiring aperture images at all the corner positions has been completed.

Figures 10A, 10B, 10C:
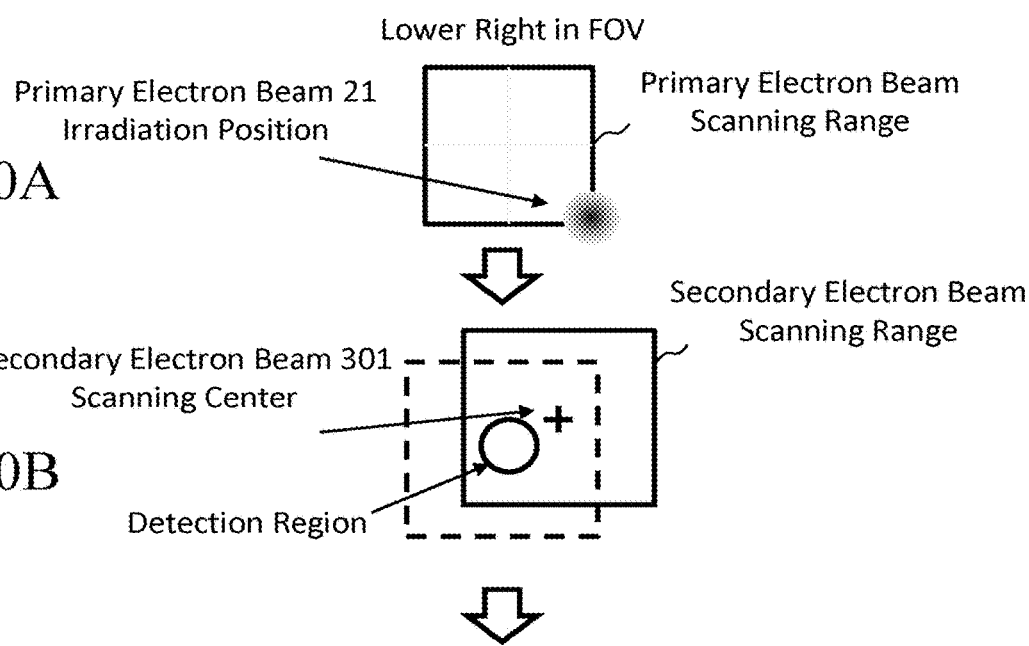
FIGS. 10A to 10C are diagrams illustrating an example of the position of a representative secondary electron beam when the lower right corner position of a scanning range of a primary electron beam is irradiated with a representative primary electron beam according to the first embodiment.

FIGS. 10A to 10C are diagrams illustrating an example of the position of the representative secondary electron beam 301 when the lower right corner position of the scanning range of a primary electron beam is irradiated with a representative primary electron beam according to the first embodiment. As shown in FIG. 10A, the position of the lower right corner of the scanning range is irradiated with the representative primary electron beam by beam deflection by the sub deflector 209.

In FIG. 10A, when the position of the lower right corner of the scanning range is irradiated with the representative primary electron beam 21, the representative secondary electron beam 301 corresponding to the representative primary electron beam 21 is emitted from the stage 105. The representative secondary electron beam 301 is projected onto the multi-detector 222 through the detector aperture array substrate 228 by the secondary electron optical system 152. Since the scanning center has not been irradiated with the representative primary electron beam 21, the scanning center position of the representative secondary electron beam 301 deviates from the center of the detection region of a corresponding detection element. FIG. 10B shows the case where the scanning center position of the representative secondary electron beam 301 has shifted, for example, to the upper right of the detection region center of the detection element. In this state, the deflector 226 performs scanning with the representative secondary electron beam 301 over the secondary beam scanning range which is currently set for the representative secondary electron beam 301.

When the position of the lower right corner of the scanning range is irradiated with the representative primary beam 21, a generated representative secondary beam reaches the upper right of a corresponding detection element. Then, only when passing over the opening of the detector aperture array substrate 228 by a scanning operation, the representative secondary electron beam 301 reaches a detection element and is detected by this detection element. Thereby, the corresponding detection element acquires an aperture image of the detector aperture array substrate 228. Since the detection region is located at the lower left of the scanning center of the representative secondary electron beam 301, the aperture image acquired by the detection element is located at the lower left of the center of the image as shown in FIG. 10C. The rectangular frame of the detected image shows a secondary beam scanning range. The detected image of the representative secondary electron beam 301 is output to the image synthesis circuit 138.

Figures 11A, 11B, 11C:
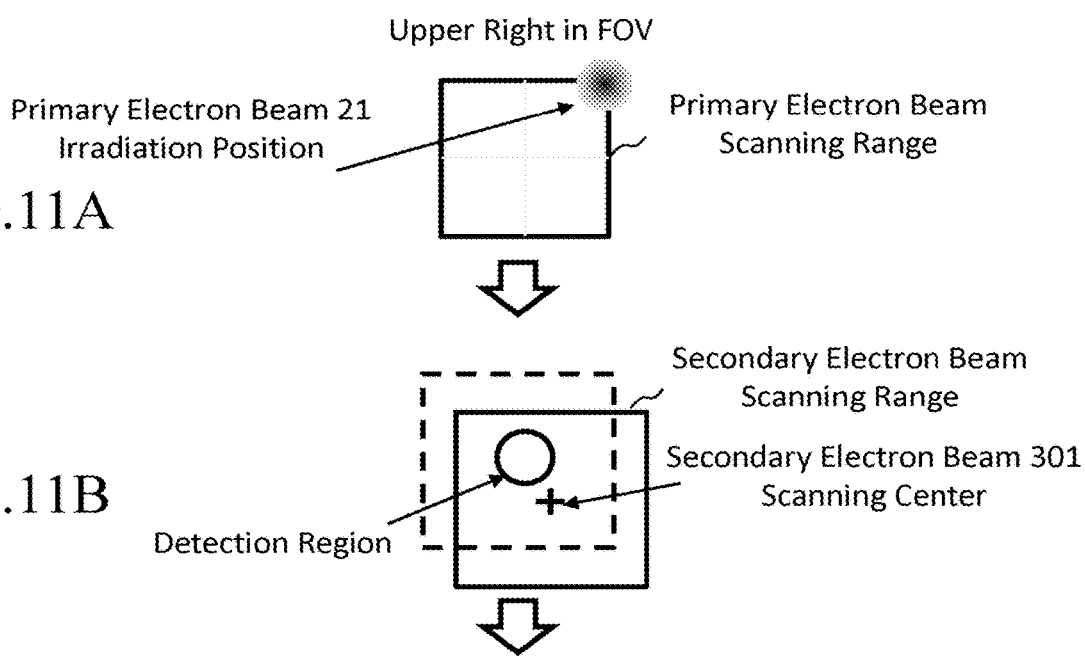
FIGS. 11A to 11C are diagrams illustrating an example of the position of a representative secondary electron beam when the upper right corner position of a scanning range of a primary electron beam is irradiated with a representative primary electron beam according to the first embodiment.

FIGS. 11A to 11C are diagrams illustrating an example of the position of the representative secondary electron beam 301 when the upper right corner position of the scanning range of a primary electron beam is irradiated with the representative primary beam 21 according to the first embodiment. As shown in FIG. 11A, the position of the upper right corner of the scanning range is irradiated with the representative primary beam 21 by beam deflection by the sub deflector 209.

In FIG. 11A, when the position of the upper right corner of the scanning range is irradiated with the representative primary beam 21, the representative secondary electron beam 301 corresponding to the representative primary electron beam 21 is emitted from the stage 105. The representative secondary electron beam 301 is projected onto the multi-detector 222 through the detector aperture array substrate 228 by the secondary electron optical system 152. Since the scanning center has not been irradiated with the representative primary beam 21, the scanning center position of the representative secondary electron beam 301 deviates from the center of the detection region of a corresponding detection element. FIG. 11B shows the case where the scanning center position of the representative secondary electron beam 301 has shifted, for example, to the lower right of the detection region center of the detection element. In this state, the deflector 226 performs scanning with the representative secondary electron beam 301 over the secondary beam scanning range which is currently set for the representative secondary electron beam 301.

When the position of the upper right corner of the scanning range is irradiated with the representative primary beam 21, a generated representative secondary beam reaches the lower right of a corresponding detection element. Then, only when passing over the opening of the detector aperture array substrate 228 by a scanning operation, the representative secondary electron beam 301 reaches a detection element and is detected by this detection element. Thereby, the corresponding detection element acquires an aperture image of the detector aperture array substrate 228. Since the detection region is located at the upper left of the scanning center of the representative secondary electron beam 301, the aperture image acquired by the detection element is located at the upper left of the center of the image as shown in FIG. 11C. The rectangular frame of the detected image shows a secondary beam scanning range. The detected image of the representative secondary electron beam 301 is output to the image synthesis circuit 138.

Figures 12A, 12B, 12C:
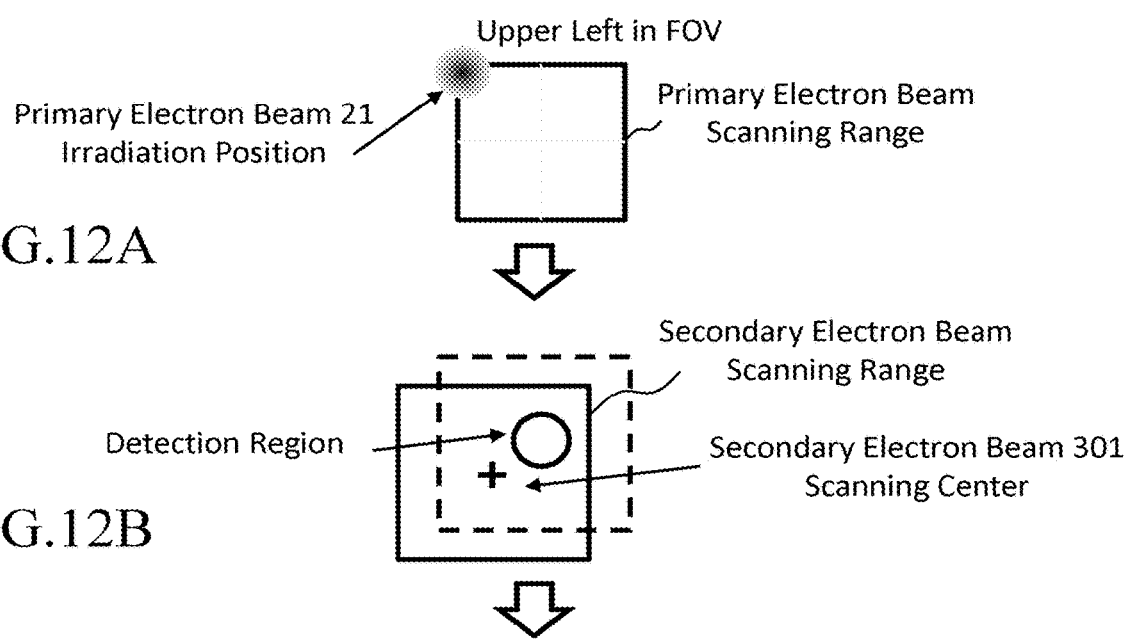
FIGS. 12A to 12C are diagrams illustrating an example of the position of a representative secondary electron beam when the upper left corner position of a scanning range of a primary electron beam is irradiated with a representative primary electron beam according to the first embodiment.

FIGS. 12A to 12C are diagrams illustrating an example of the position of the representative secondary electron beam 301 when the upper left corner position of the scanning range of a primary electron beam is irradiated with the representative primary beam 21 according to the first embodiment. As shown in FIG. 12A, the position of the upper left corner of the scanning range is irradiated with the representative primary beam 21 by beam deflection by the sub deflector 209.

In FIG. 12A, when the position of the upper left corner of the scanning range is irradiated with the representative primary beam 21, the representative secondary electron beam 301 corresponding to the representative primary electron beam 21 is emitted from the stage 105. The representative secondary electron beam 301 is projected onto the multi-detector 222 through the detector aperture array substrate 228 by the secondary electron optical system 152. Since the scanning center has not been irradiated with the representative primary beam 21, the scanning center position of the representative secondary electron beam 301 deviates from the center of the detection region of a corresponding detection element. FIG. 12B shows the case where the scanning center position of the representative secondary electron beam 301 has shifted, for example, to the lower left of the detection region center of the detection element. In this state, the deflector 226 performs scanning with the representative secondary electron beam 301 over the secondary beam scanning range which is currently set for the representative secondary electron beam 301.

When the position of the upper left corner of the scanning range is irradiated with the representative primary beam 21, a generated representative secondary beam reaches the lower left of a corresponding detection element. Then, only when passing over the opening of the detector aperture array substrate 228 by a scanning operation, the representative secondary electron beam 301 reaches a detection element and is detected by this detection element. Thereby, the corresponding detection element acquires an aperture image of the detector aperture array substrate 228. Since the detection region is located at the upper right of the scanning center of the representative secondary electron beam 301, the aperture image acquired by the detection element is located at the upper right of the center of the image as shown in FIG. 12C. The rectangular frame of the detected image shows a secondary beam scanning range. The detected image of the representative secondary electron beam 301 is output to the image synthesis circuit 138.

In the image synthesis step (S120), the image synthesis circuit 138 synthesizes detected images of the secondary electron beam 301, each of which has been detected at each of a plurality of positions in the deflection range of a primary electron beam.

Figure 13A:
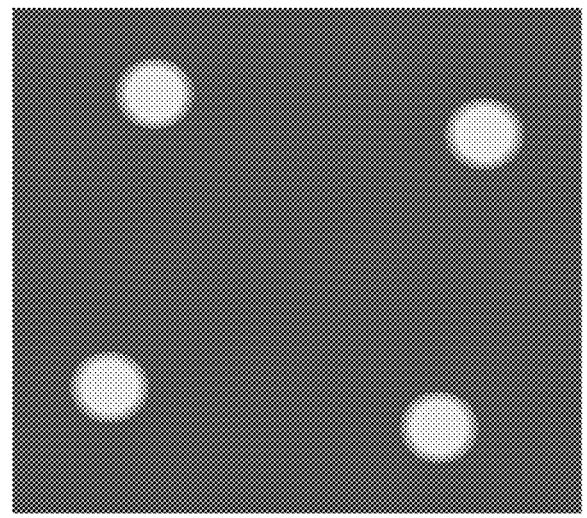
FIGS. 13A and 13B are diagrams illustrating an example of a synthetic image according to the first embodiment.
Figure 13B:
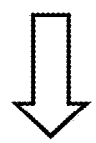
Figure 13B:
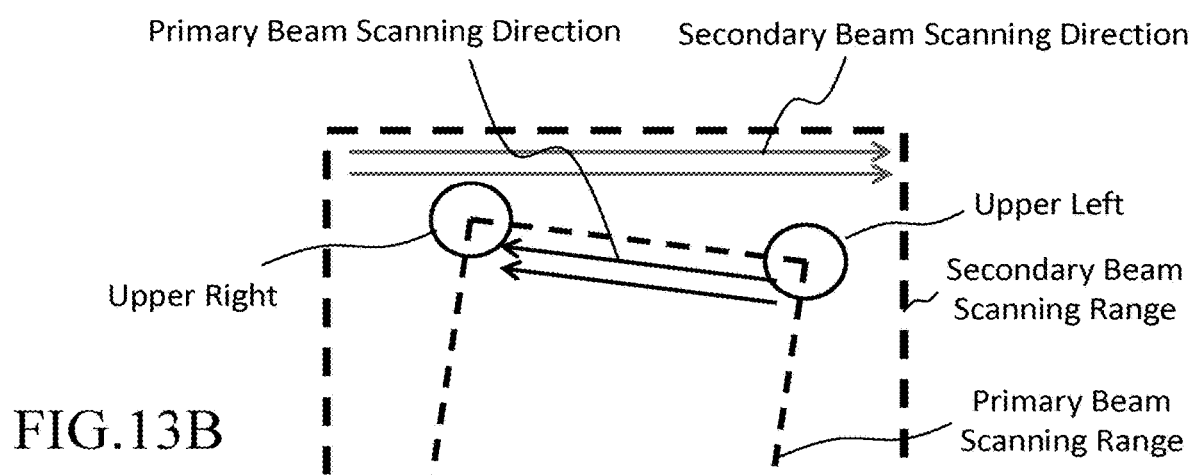

FIGS. 13A and 13B are diagrams illustrating an example of a synthetic image according to the first embodiment. FIG. 13A shows an example of a synthetic image obtained by synthesizing aperture images acquired at four corner positions. As shown in FIG. 13B, the rectangular frame of the synthetic image shows a secondary beam scanning range. The rectangular frame formed by connecting the centers of the four aperture images shows a primary beam scanning range. For example, in the case where the scanning direction of a primary electron beam forwards from the left to the right of the primary beam scanning range, the scanning direction of a secondary electron beam forwards in an opposite direction in order to cancel the scanning of the primary electron beam. In the example of FIG. 13B, it turns out based on the synthetic image that a magnification deviation occurs between the primary beam scanning range and the secondary beam scanning range. Further, it turns out that a rotation deviation occurs between the primary beam scanning range and the secondary beam scanning range.

The synthetic image acquisition unit 66 acquires a generated synthetic image from the image synthesis circuit 138, and stores it in the storage device 67 temporarily.

In the coordinate acquisition step (S121), based on a detected image of a representative secondary electron beam which has been detected at each of a plurality of positions in a primary electron beam deflection range, the coordinate acquisition unit 70 acquires a plurality of coordinates corresponding to the plurality of positions. Specifically, the coordinate acquisition unit 70 acquires, using a synthesized image, a plurality of coordinates corresponding to the plurality of positions. For example, a vector from the image center of a detected image, which is the scanning center of a secondary electron beam, to each aperture image is calculated. The position of the image center of a detected image is the position of a corresponding detection element. The position of each detection element of the multi-detector 222 is known in advance. Therefore, each coordinate can be obtained by adding a relative position from the position of a corresponding detection element to the position of the corresponding detection element. Alternatively, supposing that coordinates of the upper left of an image are (0, 0), each coordinate may be obtained by calculating the number of pixels from the upper left of the image to the position equivalent to each beam center coordinates.

In the secondary beam deflection condition calculation step (S122), using a plurality of acquired coordinates, the deflection condition calculation unit 68 calculates secondary beam deflection conditions such that the movement of the representative secondary electron beam 301 caused by the movement of the representative primary electron beam 21 in the primary beam scanning range is canceled and an irradiation position of the representative secondary electron beam 301 to a corresponding detection element is fixed. The plurality of coordinates are acquired from synthesized images.

Here, the method for obtaining the plurality of coordinates corresponding to the plurality of positions is not limited to obtaining from synthetic images. For example, if a beam position in a detected image at each of four positions before synthesizing is calculated using coordinates based on the same origin (e.g., upper left of an image), relative coordinates among four beams can be acquired by comparison.

The deflection condition calculation unit 68 calculates each parameter of deflection conditions. A deflection magnification and a deflection rotation angle are included in the parameters of deflection conditions of a secondary electron beam. Specifically, it operates as described below.

Figure 14:
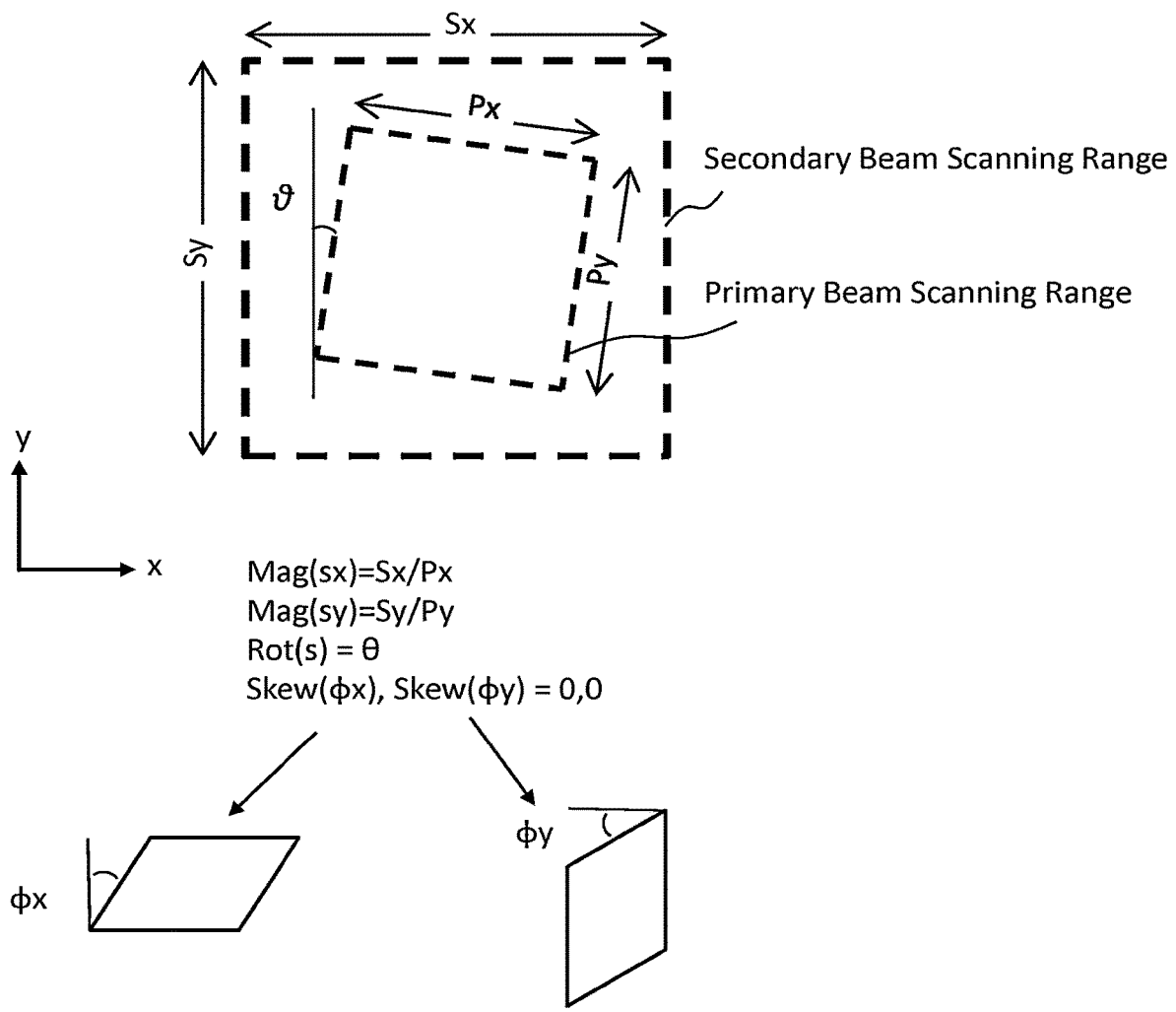
FIG. 14 is a diagram showing an example of a relative relationship between a primary beam scanning range and a secondary beam scanning range according to the first embodiment.

FIG. 14 is a diagram showing an example of a relative relationship between a primary beam scanning range and a secondary beam scanning range according to the first embodiment. The deflection condition calculation unit 68 calculates an x-direction deflection magnification Mag(sx) of a secondary beam scanning range, a y-direction deflection magnification Mag(sy) of the secondary beam scanning range, and a deflection rotation angle θ between the primary beam scanning range and the secondary beam scanning range. In the example of FIG. 14, the x-direction deflection magnification Mag(sx) of the secondary beam scanning range is defined by a value obtained by dividing an x-direction width Sx of the secondary beam scanning range by an x-direction width Px of the primary beam scanning range. The y-direction deflection magnification Mag(sy) of the secondary beam scanning range is defined by a value obtained by dividing a y-direction width Sy of the secondary beam scanning range by a y-direction width Py of the primary beam scanning range. It is more preferable for the deflection condition calculation unit 68 to calculate an x-direction skew Skew(Φx) and a y-direction skew Skew (Φy) of the primary beam scanning range against the secondary beam scanning range. The skew Skew(Φx) indicates an amount of distortion in the x direction of the rectangle. The skew Skew(Φy) indicates an amount of distortion in the y direction of the rectangle. FIG. 14 shows the case where Skew(Φx)=0 and Skew(Φy)=0.

In the secondary beam deflection condition setting step (S124), the deflection control circuit 128 sets calculated deflection conditions of the secondary electron beam. In other words, deflection conditions of the deflector 226 are set. Specifically, the deflection control circuit 128 sets a value obtained by dividing a temporary x-direction scan width by a deflection magnification Mag(sx), and a value obtained by dividing a temporary y-direction scan width by a deflection magnification Mag(sy). The deflection range is rotated by a deflection rotation angle θ. If Skew(Φx) and Skew(Φy) are finite values, deflection is performed so that the Skew (Φx) and the Skew (Φy) may be zero.

Figure 15:
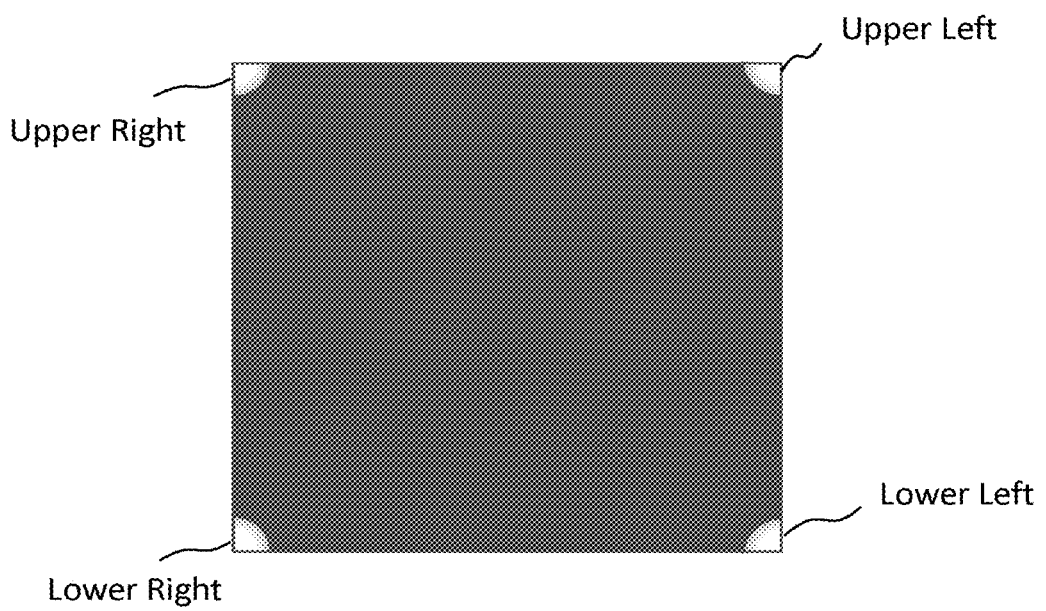
FIG. 15 is a diagram illustrating an example of a synthetic image after adjustment according to the first embodiment.

FIG. 15 is a diagram illustrating an example of a synthetic image after adjustment according to the first embodiment. When the primary beam scanning range and the secondary beam scanning range are coincident with each other, the centers of four aperture images are individually and correspondingly located at the four corners in the synthetic image as shown in FIG. 15. By setting calculated deflection conditions of the secondary electron beam, it becomes possible to make the primary beam scanning range and the secondary beam scanning range be in coincidence with each other as shown in FIG. 15.

In the inspection image acquisition step (S130), the image acquisition mechanism 150 irradiates a substrate with the multiple primary electron beams 20 in order to acquire a secondary electron image of the substrate 101 using the multiple secondary electron beams 300 emitted from the substrate. In other words, the sub deflector 209 performs scanning of a primary electron beam scanning range on the substrate 101 placed on the stage 105 with the multiple primary electron beams 20. Then, while performing scanning with the multiple secondary electron beams 300 emitted from the substrate 101 due to beam deflection by the deflector 226 based on calculated secondary beam deflection conditions, multiple secondary electron beams are detected by the multi-detector 222. Thereby, a secondary electron image of the substrate 101 is obtained.

The image acquisition mechanism 150 proceeds with a scanning operation per stripe region 32 as described above. A reflected electron may be included in detected multiple secondary electron beams 300. Alternatively, a reflected electron may be separated during moving in the secondary electron optical system 152 and may not reach the multi-detector 222. Detected data (measured image data: secondary electron image data: inspection image data) on a secondary electron of each pixel in each sub-irradiation region 29 detected by the multi-detector 222 is output to the detection circuit 106 in order of measurement. In the detection circuit 106, the detected data in analog form is converted into digital data by an A-D converter (not shown), and stored in the chip pattern memory 123. Then, acquired measured image data is transmitted to the comparison circuit 108, together with information on each position from the position circuit 107.

As the image acquisition operation described above, a step-and-repeat operation may be performed which irradiates the substrate 101 with the multiple primary electron beams 20 in the state where the stage 105 is stopped, and which moves the position after finishing the scanning operation. Alternatively, it is also preferable to irradiate the substrate 101 with the multiple primary electron beams 20 while continuously moving the stage 105. When the multiple primary electron beams 20 irradiate the substrate 101 while the stage 105 is continuously moving, the main deflector 208 executes a tracking operation by performing collective deflection so that the irradiation position of the multiple primary electron beams 20 may follow the movement of the stage 105. Therefore, the emission position of the multiple secondary electron beams 300 changes every second with respect to the trajectory central axis of the multiple primary electron beams 20. Further, it is preferable for the deflector 226 to collectively deflect the multiple secondary electron beams 300 so that each secondary electron beam whose emission position has changed due to the tracking operation may be applied to a corresponding detection region of the multi-detector 222.

Figure 16:
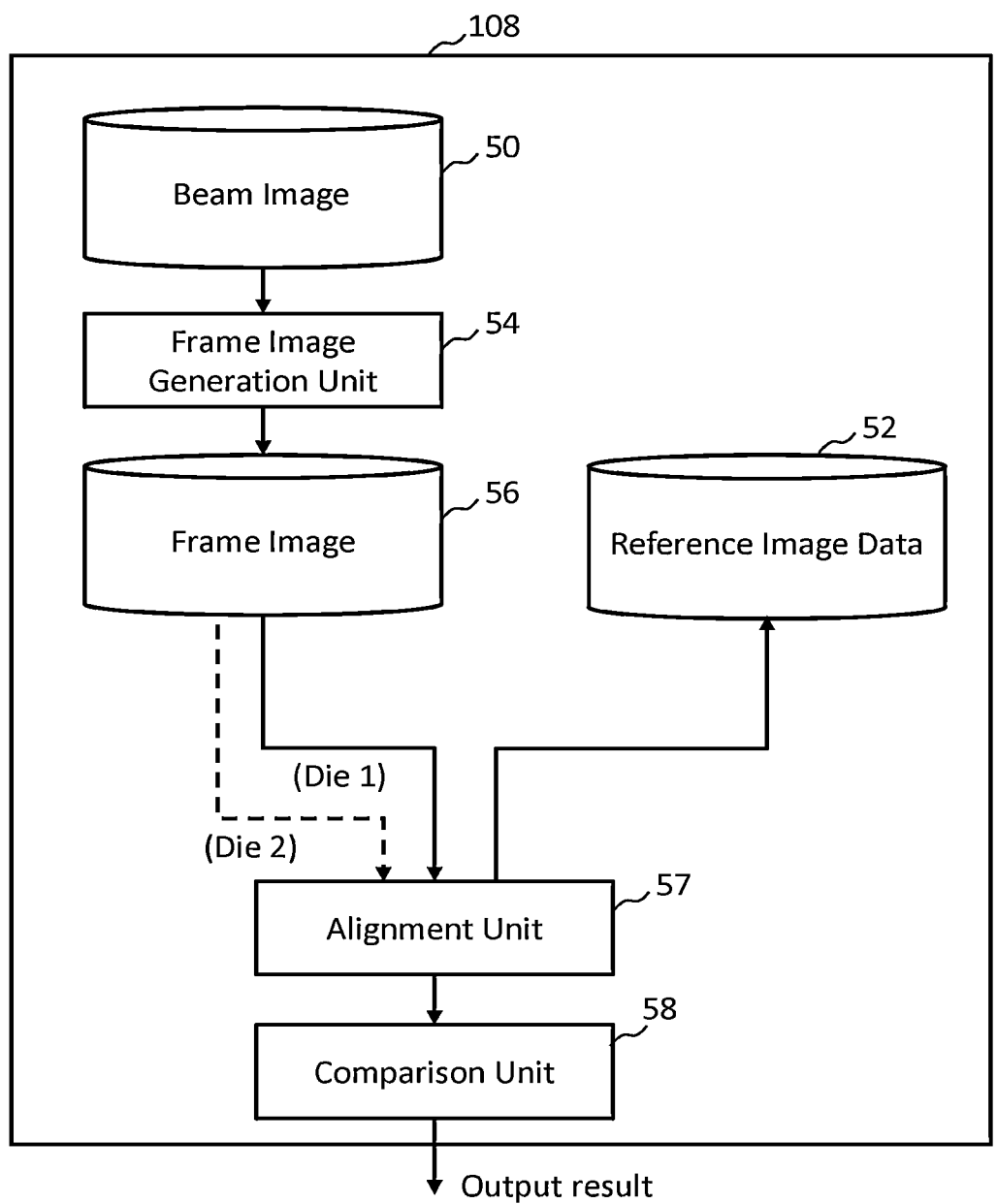
FIG. 16 is a diagram showing an example of an internal configuration of a comparison circuit according to the first embodiment.

FIG. 16 is a diagram showing an example of an internal configuration of a comparison circuit according to the first embodiment. In FIG. 16, storage devices 50, 52 and 56, such as magnetic disk drives, a frame image generation unit 54, an alignment unit 57, and a comparison unit 58 are arranged in the comparison circuit 108. Each of the "units" such as the frame image generation unit 54, the alignment unit 57 and the comparison unit 58 includes processing circuitry. The processing circuitry includes an electric circuit, a computer, a processor, a circuit board, a quantum circuit, a semiconductor device, or the like. Further, common processing circuitry (same processing circuitry), or different processing circuitry (separate processing circuitry) may be used for each of the "units". Input data required in the frame image generation unit 54, the alignment unit 57 and the comparison unit 58, or a calculated result is stored in a memory (not shown) or in the memory 118 each time.

Measured image data (beam image) transmitted into the comparison circuit 108 is stored in the storage device 50.

The frame image generation unit 54 generates the frame image 31 of each of a plurality of frame regions 30 obtained by further dividing image data of the sub-irradiation region 29 acquired by scanning with each primary electron beam 8. The frame region 30 is used as a unit region of an inspection image. In order to prevent missing an image, it is preferable that margin regions overlap each other in each frame region 30. The generated frame image 31 is stored in the storage device 56.

In the reference image generation step (S132), the reference image generation circuit 112 generates, for each frame region 30, a reference image corresponding to the frame image 31, based on design data serving as a basis of a plurality of figure patterns formed on the substrate 101. Specifically, it operates as follows: First, design pattern data is read from the storage device 109 through the control computer 110, and each figure pattern defined by the read design pattern data is converted into image data of binary or multiple values.

Basic figures defined by the design pattern data are, for example, rectangles (including squares) and triangles. For example, there is stored figure data defining the shape, size, position, and the like of each pattern figure by using information, such as coordinates (x, y) of the reference position of the figure, lengths of sides of the figure, and a figure code serving as an identifier for identifying the figure type such as a rectangle, a triangle and the like.

When design pattern data serving as the figure data is input to the reference image generation circuit 112, the data is developed into data of each figure, and then, a figure code indicating the figure shape, figure dimensions, and the like of each figure data are interpreted. Then, the reference image generation circuit 112 develops each figure data to design pattern image data of binary or multiple values as a pattern to be arranged in squares in units of grids of predetermined quantization dimensions, and outputs the developed data. In other words, the reference image generation circuit 112 reads design data, calculates the occupancy of a figure in the design pattern, for each square region obtained by virtually dividing the inspection region into squares in units of predetermined dimensions, and outputs n-bit occupancy data. For example, it is preferable to set one square as one pixel. Assuming that one pixel has a resolution of $1/2^8 (=1/256)$, the occupancy rate in each pixel is calculated by allocating sub regions each being $1/256$ to the region of a figure arranged in the pixel. Then, it becomes 8-bit occupancy data. Such square regions (inspection pixels) can be corresponding to pixels of measured data.

Next, the reference image generation circuit 112 performs filtering processing on design image data of a design pattern which is image data of a figure, using a predetermined filter function. Thereby, it becomes possible to match/fit the design image data being design side image data, whose image intensity (gray scale level) is represented by digital values, with image generation characteristics obtained by irradiation with the multiple primary electron beams 20. The generated image data for each pixel of a reference image is output to the comparison circuit 108. The reference image data transmitted into the comparison circuit 108 is stored in the storage device 52.

In the comparison step (S140), the alignment unit 57 reads the frame image 31 serving as an inspection image, and a reference image corresponding to the frame image 31, and provides alignment between both the images, based on units of sub-pixels smaller than units of pixels. For example, the alignment can be performed by a least-square method.

Then, the comparison unit 58 compares at least a portion of an acquired secondary electron image with a predetermined image. Here, a frame image obtained by further dividing the image of the sub-irradiation region 29 acquired for each beam is used. Then, the comparison unit 58 compares, for each pixel, the frame image 31 and the reference image. The comparison unit 58 compares them, for each pixel, based on predetermined determination conditions in order to determine whether there is a defect such as a shape defect. For example, if a difference in gray scale level for each pixel is larger than a determination threshold Th, it is determined that there is a defect. Then, the comparison result is output. It may be output to the storage device 109 or the memory 118, or alternatively, output from the printer 119.

In the examples described above, the die-to-database inspection is performed. However, it is not limited thereto. A die-to-die inspection may be performed. In the case of the die-to-die inspection, alignment and comparison having been described above are carried out between the frame image 31 (die 1) to be inspected and another frame image 31 (die 2) (another example of a reference image) in which there is formed the same pattern as that of the frame image 31 to be inspected.

According to the first embodiment, as described above, it is possible to acquire images with respect to which deflection adjustment of multiple secondary electron beams has been performed for canceling the position movement of the multiple secondary electron beams resulting from scanning with multiple primary electron beams, without using another measurement means different from the multi-detector 222 for acquiring the images.

Second Embodiment

The first embodiment describes the configuration in which, in order to select the representative primary electron beam 21 from the multiple primary electron beams 20, the other beam arrays are blocked by the beam selection aperture substrate 232. A second embodiment describes a configuration in which, without blocking a portion of the multiple primary electron beams 20, all of them are applied for irradiation. The configuration of the inspection apparatus 100 according to the second embodiment may be the same as that in FIG. 1. However, the beam selection aperture substrate 232, the drive mechanism 234, and the beam selection aperture control circuit 136 may be omitted. The main steps of the inspection method according to the second embodiment may be the same as those in FIG. 6. Further, the contents of the second embodiment may be the same as those of the first embodiment except for what is particularly described below.

Figure 17:
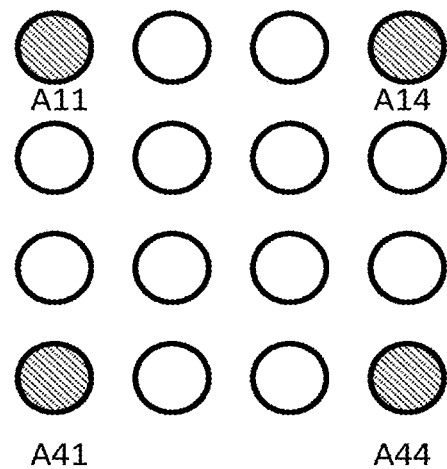
FIG. 17 is a diagram for illustrating a representative primary electron beam according to a second embodiment.

FIG. 17 is a diagram for illustrating a representative primary electron beam according to the second embodiment. FIG. 17 shows the case of using 4×4 multiple primary electron beams 20. According to the first embodiment, the reason for limiting (confining) beams to be applied for irradiation is to identify which beam in an acquired image is a target beam. However, when irradiating all the multiple primary electron beams 20, it is difficult to identify which beam is a target beam in an image obtained in the center region of a beam array. On the other hand, as shown in FIG. 17, the four corner beams A11, A14, A41, and A44 at the four corners of the multiple primary electron beams 20 are identifiable based on the arrangement relation. Then, in the second embodiment, deflection conditions of a secondary electron beam are obtained by using at least one of the four corner beams.

In the beam selection step (S102), the beam selection unit 60 selects a representative primary electron beam from the multiple primary electron beams 200. Here, one is selected from the four corner beams A11, A14, A41, and A44 shown in FIG. 17. The corner beam A14 is selected here, for example. It is not necessary to block the other remaining beams in the multiple primary electron beams 20 according to the second embodiment.

The contents of the scanning condition setting step (S104) are the same as those of the first embodiment.

In the primary beam position setting step (S106), the corner position setting unit 63 sets one of the positions of the four corners of the scanning range of a primary electron beam. For example, the position of the lower left corner of the scanning range of the primary electron beam is set.

In the primary beam irradiation step (S108), the image acquisition mechanism 150 applies the multiple primary electron beams 20 including a representative primary electron beam to the stage 105. At this time, the main deflector 208 matches the center of multiple primary electron beams with the position of the trajectory central axis of the multiple primary electron beams. If, without being deflected, the center of multiple primary electron beams is located at the trajectory central axis of the multiple primary electron beams, it is acceptable to provide no deflection.

Next, the sub deflector 209 (primary deflector) applies the representative primary electron beam to a plurality of positions in a preset primary electron beam deflection range (scanning range) on the stage 105 in order while shifting the time of applying the beam. Here, the sub deflector 209 deflects the representative primary electron beam so that the lower left corner position of the preset scanning range of the primary electron beam may be irradiated with the representative primary electron beam. With respect also to the other beam arrays of the multiple primary electron beams 20, the position of the lower left corner of the scanning range of each primary electron beam is irradiated by such deflection.

Figure 18A:
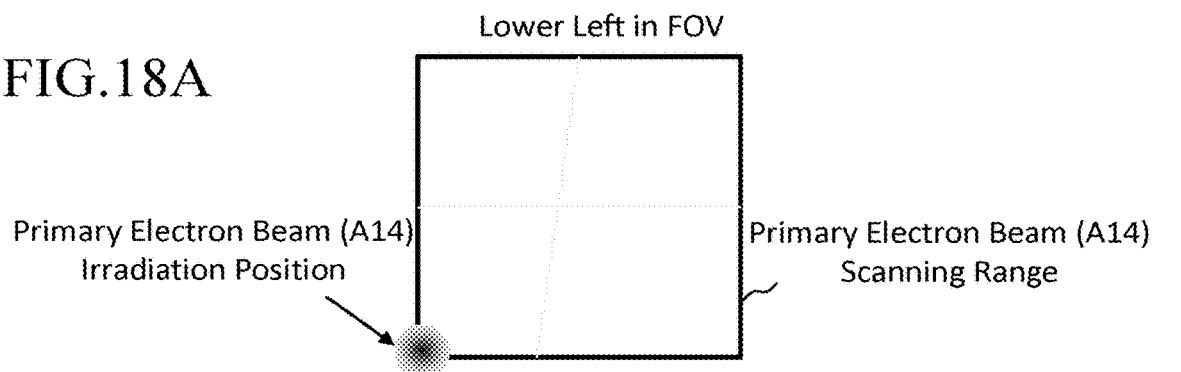
FIGS. 18A to 18C are diagrams illustrating an example of the position of a representative secondary electron beam when the lower left corner position of a scanning range of a primary electron beam is irradiated with a representative primary electron beam according to the second embodiment.
Figure 18B:
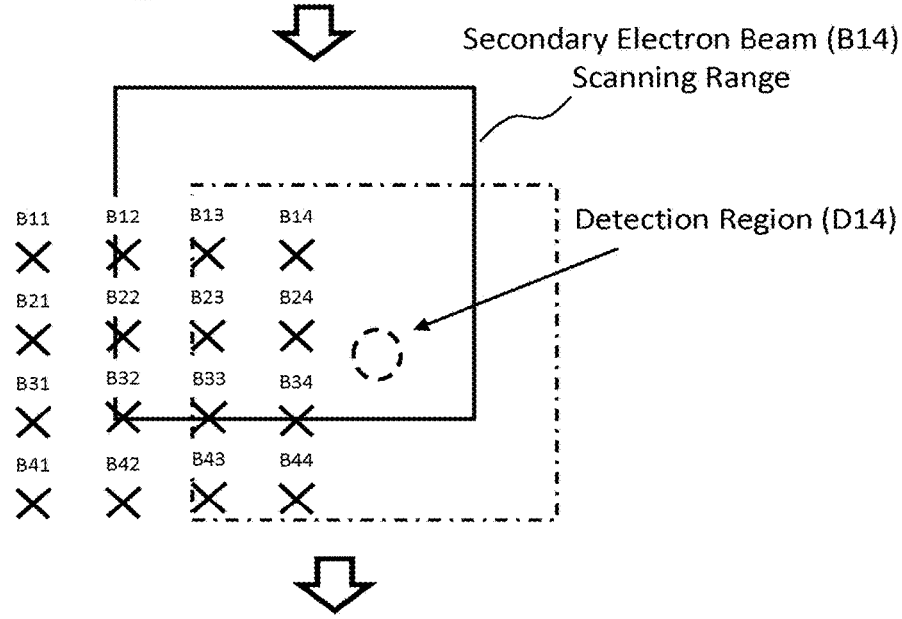
Figure 18C:
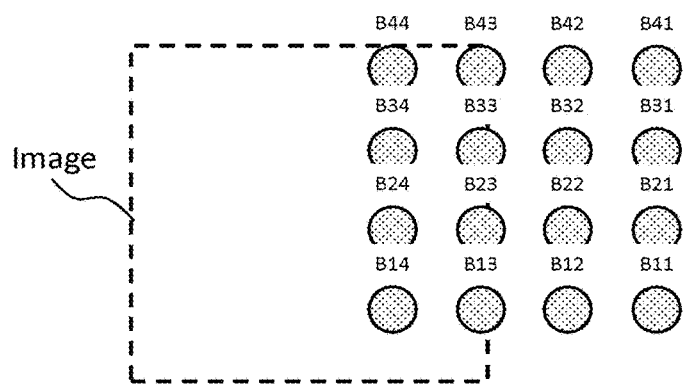

FIGS. 18A to 18C are diagrams illustrating an example of the position of a representative secondary electron beam when the lower left corner position of the scanning range of a primary electron beam is irradiated with a representative primary electron beam according to the second embodiment. As shown in FIG. 18A, the position of the lower left corner of the scanning range is irradiated with the representative primary electron beam A14 by beam deflection by the sub deflector 209.

In the secondary beam scanning step (S110), the deflector 226 (secondary deflector) performs scanning with a representative secondary electron beam emitted from the position concerned due to irradiation of the representative primary electron beam, based on temporary secondary beam deflection conditions, over each of a plurality of positions in the deflection range of a representative primary electron beam. Here, as the plurality of positions in the deflection range of the representative primary beam, the four corner positions are used as described above. Then, here, the lower left corner position of the deflection range of the representative primary beam is scanned with the multiple primary electron beams 20 including the representative secondary electron beam A14 by collective deflection by the deflector 226.

In FIG. 18A, when the position of the lower left corner of the scanning range is irradiated with a representative primary electron beam, the representative secondary electron beam B14 corresponding to the representative primary electron beam is emitted from the stage 105. Simultaneously, secondary electron beams corresponding to other respective primary electron beams are emitted from the stage 105. These multiple secondary electron beams 300 are projected onto the multi-detector 222 through the detector aperture array substrate 228 by the secondary electron optical system 152. Since the scanning center has not been irradiated with the representative primary electron beam A14, the scanning center position of the representative secondary electron beam B14 deviates from the center of the detection region of a corresponding detection element D14. FIG. 18B shows the case where the scanning center position of the representative secondary electron beam B14 has shifted, for example, to the upper left of the detection region center of the detection element. In this state, the deflector 226 performs scanning with the multiple secondary electron beams 300 over the secondary beam scanning range which is currently set for the multiple secondary electron beams 300 including a representative secondary electron beam.

In the secondary beam detection (image acquisition) step (S112), the corresponding detection element D14 of the multi-detector 222 detects, for each of a plurality of positions in the deflection range of the representative primary beam A14, the representative secondary electron beam B14 with which scanning has been performed based on temporary secondary beam deflection conditions. Here, with respect to the lower left corner position of the deflection range of the representative primary beam, the representative secondary electron beam B14 with which scanning has been performed is detected. Only when passing over the opening of the detector aperture array substrate 228 by a scanning operation, the representative secondary electron beam B14 reaches the detection element D14 and is detected by this element.

At this point, according to the second embodiment, in order to identify that the representative secondary electron beam B14 is a corner beam, the secondary beam scanning range is set such that the detection element D14 detects two or more secondary electron beams in each of the x and y directions. Accordingly, the scanning range is set so that scanning for two beam pitches in the x and y directions from the scanning center of a secondary electron beam can be conducted. FIG. 18B shows the case where each of the scan widths in the x and y directions of the secondary beam scanning range is set to be four times the beam pitch. Thereby, aperture images of the detector aperture array substrate 228, for a plurality of beams, are acquired by the corresponding detection element D14. Since the detection region is located at the lower right of the scanning center of the representative secondary electron beam B14, the aperture image corresponding to the representative secondary electron beam B14 acquired by the detection element D14 is located at the lower right of the center of the image as shown in FIG. 18C. Aperture images of other detected secondary electron beams B13, B24, B23, B34, B33, B44, and B43 are arranged at positions in accordance with the arrangement of the beam array. Since the representative secondary electron beam B14 is a corner beam, even when aperture images of a plurality of secondary electron beams are acquired (captured) together, it is possible to identify that the aperture image at the corner is that of the representative secondary electron beam B14. The rectangular frame of the detected image indicates the scanning range of the secondary beam. The detected image of the representative secondary electron beam B14 is output to the image synthesis circuit 138.

The contents of the determination step (S114) and the determination step (S116) are the same as those of the first embodiment.

Figure 19A:
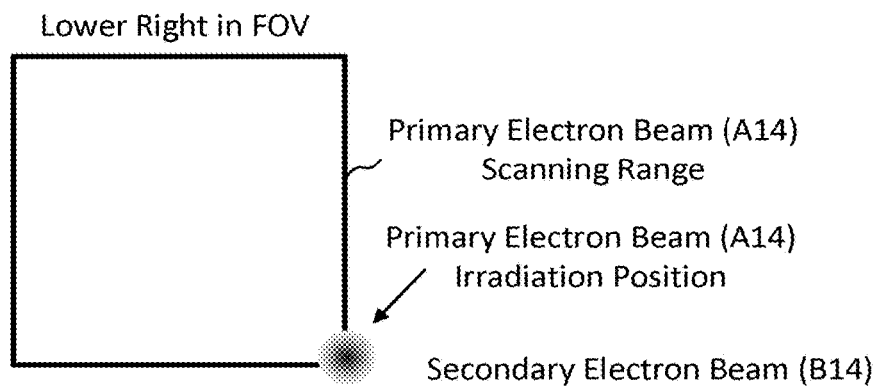
FIGS. 19A to 19C are diagrams illustrating an example of the position of a representative secondary electron beam when the lower right corner position of a scanning range of a primary electron beam is irradiated with a representative primary electron beam according to the second embodiment.
Figure 19B:
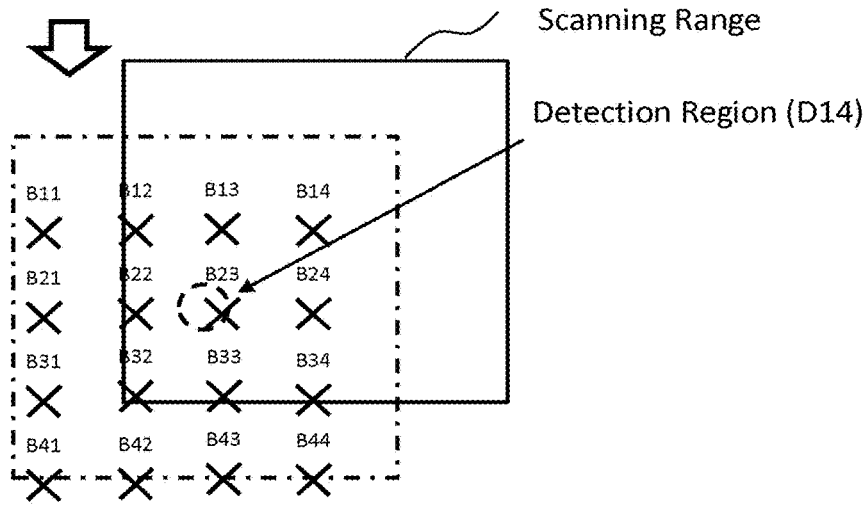
Figure 19C:
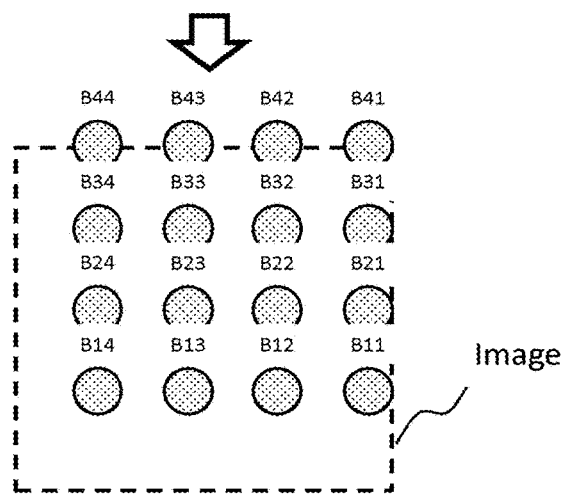

FIGS. 19A to 19C are diagrams illustrating an example of the position of a representative secondary electron beam when the lower right corner position of the scanning range of a primary electron beam is irradiated with a representative primary electron beam according to the second embodiment. As shown in FIG. 19A, the position of the lower right corner of the scanning range is irradiated with the representative primary electron beam A14 by beam deflection by the sub deflector 209.

In FIG. 19A, when the position of the lower right corner of the scanning range is irradiated with a representative primary electron beam A14, the representative secondary electron beam B14 corresponding to the representative primary electron beam A14 is emitted from the stage 105. Simultaneously, secondary electron beams corresponding to other respective primary electron beams are emitted from the stage 105. These multiple secondary electron beams 300 are projected onto the multi-detector 222 through the detector aperture array substrate 228 by the secondary electron optical system 152. Since the scanning center has not been is irradiated with the representative primary electron beam A14, the scanning center position of the representative secondary electron beam B14 deviates from the center of the detection region of the corresponding detection element D14. FIG. 19B shows the case where the scanning center position of the representative secondary electron beam B14 has shifted, for example, to the upper right of the detection region center of the detection element D14. In this state, the deflector 226 performs scanning with the multiple secondary electron beams 300 over the secondary beam scanning range which is currently set for the multiple secondary electron beams 300 including a representative secondary electron beam.

In the secondary beam detection (image acquisition) step (S112), here, with respect to the lower right corner position of the deflection range of a representative primary beam, the representative secondary electron beam B14 with which scanning has been performed is detected. FIG. 19B shows the case where each of the scan widths in the x and y directions of the secondary beam scanning range is set to be four times the beam pitch. Thereby, aperture images of the detector aperture array substrate 228, for a plurality of beams, are acquired by the corresponding detection element D14. Since the detection region is located at the lower left of the scanning center of the representative secondary electron beam B14, the aperture image corresponding to the representative secondary electron beam B14 acquired by the detection element D14 is located at the lower left of the center of the image as shown in FIG. 19C. Aperture images of other detected secondary electron beams B11 to B13, B21 to B24, B31 to B34, and B41 to B44 are arranged at positions in accordance with the arrangement of the beam array. Since the representative secondary electron beam B14 is a corner beam, even when aperture images of a plurality of secondary electron beams are acquired (captured) together, it is possible to identify that the aperture image at the corner is that of the representative secondary electron beam B14. The rectangular frame of the detected image indicates the scanning range of the secondary beam. The detected image of the representative secondary electron beam B14 is output to the image synthesis circuit 138.

Figure 20A:
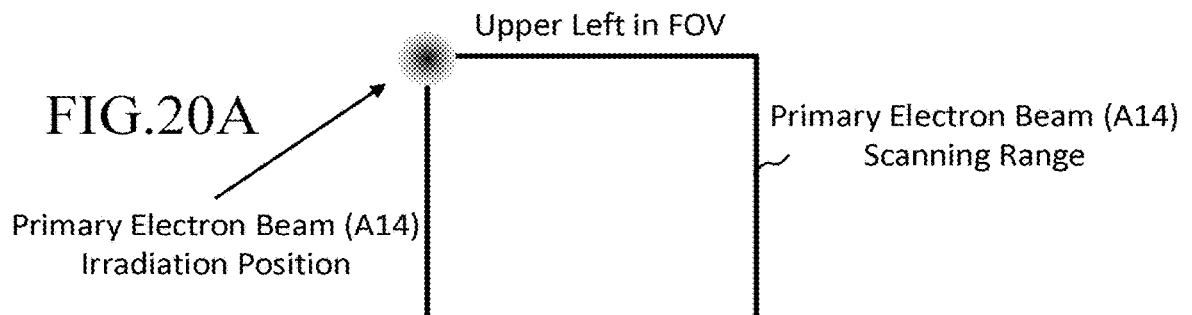
FIGS. 20A to 20C are diagrams illustrating an example of the position of a representative secondary electron beam when the upper left corner position of a scanning range of a primary electron beam is irradiated with a representative primary electron beam according to the second embodiment.
Figure 20B:
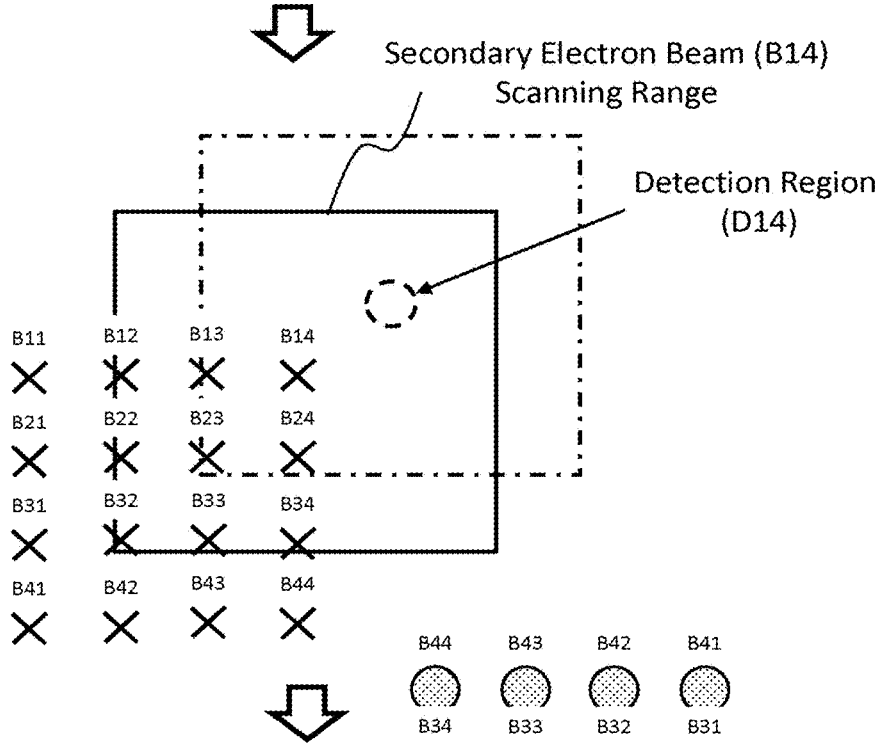
Figure 20C:
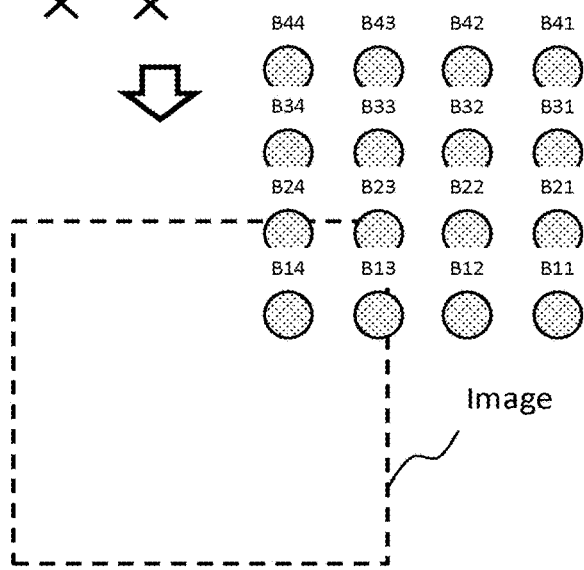

FIGS. 20A to 20C are diagrams illustrating an example of the position of a representative secondary electron beam when the upper left corner position of the scanning range of a primary electron beam is irradiated with a representative primary electron beam according to the second embodiment. As shown in FIG. 20A, the representative primary electron beam A14 irradiates the position of the upper left corner of the scanning range by beam deflection by the sub deflector 209.

In FIG. 20A, when the representative primary electron beam A14 irradiates the position of the upper left corner of the scanning range, the representative secondary electron beam B14 corresponding to the representative primary electron beam A14 is emitted from the stage 105. Simultaneously, secondary electron beams corresponding to other respective primary electron beams are emitted from the stage 105. These multiple secondary electron beams 300 are projected onto the multi-detector 222 through the detector aperture array substrate 228 by the secondary electron optical system 152. Since the scanning center has not been irradiated with the representative primary electron beam A14, the scanning center position of the representative secondary electron beam B14 deviates from the center of the detection region of the corresponding detection element D14. FIG. 20B shows the case where the scanning center position of the representative secondary electron beam B14 has shifted, for example, to the lower left of the detection region center of the detection element D14. In this state, the deflector 226 performs scanning with the multiple secondary electron beams 300 over the secondary beam scanning range which is currently set for the multiple secondary electron beams 300 including a representative secondary electron beam.

In the secondary beam detection (image acquisition) step (S112), here, with respect to the upper left corner position of the deflection range of the representative primary beam, the representative secondary electron beam B14 with which scanning has been performed is detected. FIG. 20B shows the case where each of the scan widths in the x and y directions of the secondary beam scanning range is set to be four times the beam pitch. Thereby, aperture images of the detector aperture array substrate 228, for a plurality of beams, are acquired by the corresponding detection element D14. Since the detection region is located at the upper right of the scanning center of the representative secondary electron beam B14, the aperture image corresponding to the representative secondary electron beam B14 acquired by the detection element D14 is located at the upper right of the center of the image as shown in FIG. 20C. Aperture images of other detected secondary electron beams B13, B24, and B233 are arranged at positions in accordance with the arrangement of the beam array. Since the representative secondary electron beam B14 is a corner beam, even when aperture images of a plurality of secondary electron beams are acquired (captured) together, it is possible to identify that the aperture image at the corner is that of the representative secondary electron beam B14. The rectangular frame of the detected image indicates the scanning range of the secondary beam. The detected image of the representative secondary electron beam B14 is output to the image synthesis circuit 138.

Figure 21A:
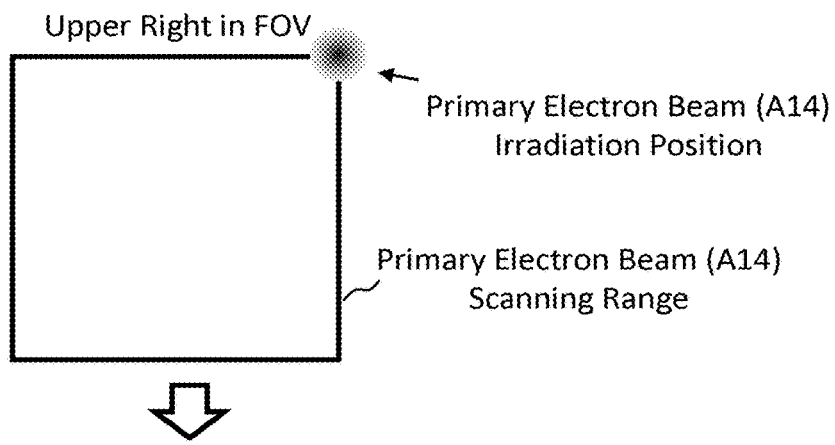
FIGS. 21A to 21C are diagrams illustrating an example of the position of a representative secondary electron beam when the upper right corner position of a scanning range of a primary electron beam is irradiated with a representative primary electron beam according to the second embodiment.
Figure 21B:
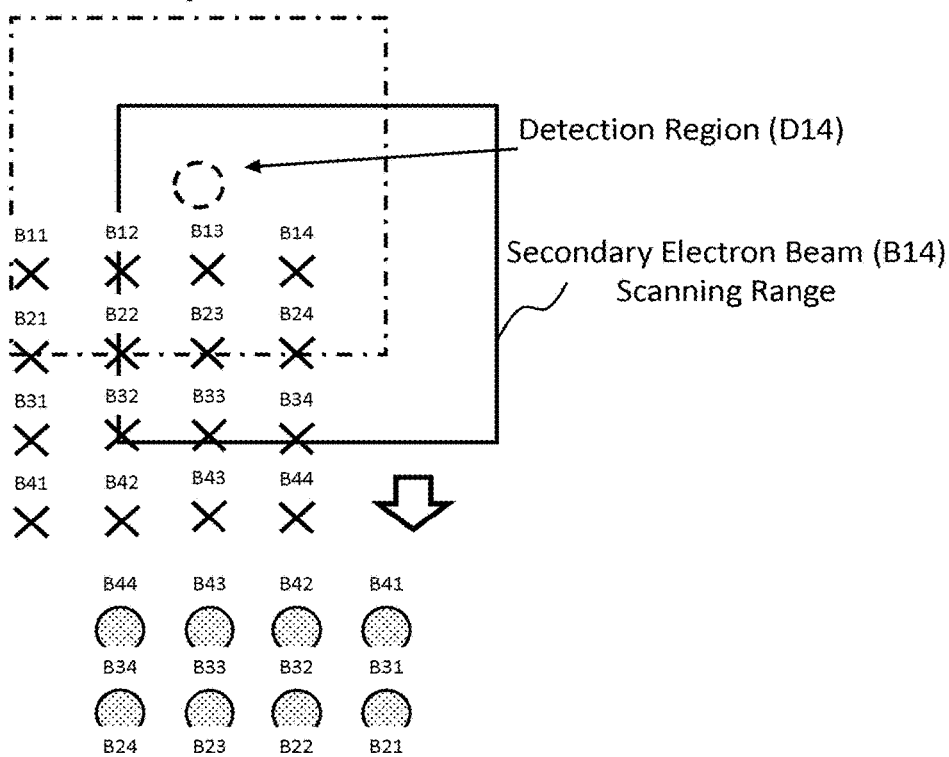
Figure 21C:
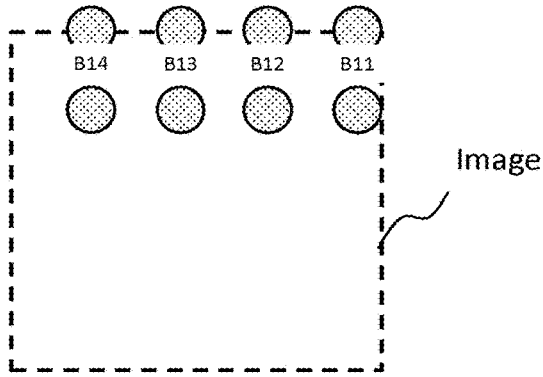

FIGS. 21A to 21C are diagrams illustrating an example of the position of a representative secondary electron beam when the upper right corner position of the scanning range of a primary electron beam is irradiated with a representative primary electron beam according to the second embodiment. As shown in FIG. 21A, the position of the upper right corner of the scanning range is irradiated with the representative primary electron beam A14 by beam deflection by the sub deflector 209.

In FIG. 21A, when the position of the upper right corner of the scanning range is irradiated with the representative primary electron beam A14, the representative secondary electron beam B14 corresponding to the representative primary electron beam A14 is emitted from the stage 105. Simultaneously, secondary electron beams corresponding to other respective primary electron beams are emitted from the stage 105. These multiple secondary electron beams 300 are projected onto the multi-detector 222 through the detector aperture array substrate 228 by the secondary electron optical system 152. Since the scanning center has not been irradiated with the representative primary electron beam A14, the scanning center position of the representative secondary electron beam B14 deviates from the center of the detection region of the corresponding detection element D14. FIG. 21B shows the case where the scanning center position of the representative secondary electron beam B14 has shifted, for example, to the lower right of the detection region center of the detection element D14. In this state, the deflector 226 performs scanning with the multiple secondary electron beams 300 over the secondary beam scanning range which is currently set for the multiple secondary electron beams 300 including a representative secondary electron beam.

In the secondary beam detection (image acquisition) step (S112), here, with respect to the upper right corner position of the deflection range of the representative primary beam, the representative secondary electron beam B14 with which scanning has been performed is detected. FIG. 21B shows the case where each of the scan widths in the x and y directions of the secondary beam scanning range is set to be four times the beam pitch. Thereby, aperture images of the detector aperture array substrate 228, for a plurality of beams, are acquired by the corresponding detection element D14. Since the detection region is located at the upper left of the scanning center of the representative secondary electron beam B14, the aperture image corresponding to the representative secondary electron beam B14 acquired by the detection element D14 is located at the upper left of the center of the image as shown in FIG. 21C. Aperture images of other detected secondary electron beams B11 to B13, and B21 to B24 are arranged at positions in accordance with the arrangement of the beam array. Since the representative secondary electron beam B14 is a corner beam, even when aperture images of a plurality of secondary electron beams are acquired (captured) together, it is possible to identify that the aperture image at the corner is that of the representative secondary electron beam B14. The rectangular frame of the detected image indicates the scanning range of the secondary beam. The detected image of the representative secondary electron beam B14 is output to the image synthesis circuit 138.

In the image synthesis step (S120), the image synthesis circuit 138 synthesizes detected images of the representative secondary electron beam B14 each of which has been detected at each of a plurality of positions in the deflection range of a primary electron beam. Thereby, as shown in FIG. 13A, an example of a synthetic image can be obtained by synthesizing aperture images acquired at the four corner positions.

As described above, even when the number of primary electron beams to be applied for irradiation is not limited to one, it is possible to obtain a synthetic image by synthesizing aperture images acquired at the four corner positions.

The contents of each of the image synthesis step (S120), the coordinate acquisition step (S121), the secondary beam deflection condition calculation step (S122), the secondary beam deflection condition setting step (S124), the inspection image acquisition step (S130), the reference image generating step (S132), and the comparison step (S140) are the same as those of the first embodiment.

The above examples describe the case where a synthetic image is generated with respect to one of four corner beams in order to calculate secondary beam deflection conditions. However, it is not limited thereto. Also, it is preferable to use, as a representative primary electron beam, beams at the four corners of the multiple primary electron beams 20, to generate a synthetic image for each of the beams at the four corners, to obtain secondary beam deflection conditions for the each of the beams at the four corners, and to calculate a statistic value of values each obtained for the each of the beams with respect to respective parameters of the secondary beam deflection conditions. For example, by calculating an average or a median, errors can be reduced more compared with the case of calculating using one beam. Thus, the accuracy of each parameter of the secondary beam deflection conditions can be increased.

According to the second embodiment, as described above, it is possible to acquire images with respect to which deflection adjustment of multiple secondary electron beams has been performed for canceling the position movement of the multiple secondary electron beams resulting from scanning with multiple primary electron beams, without limiting the number of primary electron beams to be applied for irradiation.

In the above description, a series of " . . . circuits" includes processing circuitry, which includes an electric circuit, a computer, a processor, a circuit board, a quantum circuit, a semiconductor device, or the like. Each " . . . circuit" may use common processing circuitry (the same processing circuitry), or different processing circuitry (separate processing circuitry). Programs for causing a processor, etc. to execute processing may be stored in a recording medium, such as a magnetic disk drive, magnetic tape drive, FD, ROM (Read Only Memory) or the like. For example, the position circuit 107, the comparison circuit 108, the reference image generation circuit 112, the stage control circuit 114, the lens control circuit 124, the blanking control circuit 126, the deflection control circuit 128, the deflection adjustment circuit 134, and the beam selection aperture control circuit 136 may be configured by at least one processing circuit described above. For example, processing in these circuits may be carried out by the control computer 110.

Embodiments have been explained referring to specific examples as described above. However, the present invention is not limited to these specific examples. Although FIG. 1 shows the case where the multiple primary electron beams 20 are formed by the shaping aperture array substrate 203 irradiated with one beam from the electron gun 201 serving as an irradiation source, it is not limited thereto. The multiple primary electron beams 20 may be formed by irradiation with a primary electron beam from each of a plurality of irradiation sources.

While the apparatus configuration, control method, and the like not directly necessary for explaining the present invention are not described, some or all of them can be appropriately selected and used on a case-by-case basis when needed.

Further, any other multiple electron beam image acquisition method, multiple electron beam image acquisition apparatus, and multiple electron beam inspection apparatus that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multiple electron beam image acquisition method comprising:
applying a representative primary electron beam selected from multiple primary electron beams to a plurality of positions in a primary electron beam deflection range of the representative primary electron beam having been preset above a stage on which a substrate is placed;
performing scanning with a representative secondary electron beam emitted from a position concerned due to the applying of the representative primary electron beam, based on temporary secondary electron beam deflection conditions, for each of the plurality of positions in the primary electron beam deflection range of the representative primary electron beam;

detecting the representative secondary electron beam with which the scanning has been performed based on the temporary secondary electron beam deflection conditions, for the each of the plurality of positions in the primary electron beam deflection range of the representative primary electron beam, by a predetermined detection element of a multi-detector including a plurality of detection elements;

acquiring a plurality of coordinates corresponding to the plurality of positions, based on detected images of the representative secondary electron beam each of which has been detected at any one of the plurality of positions in the primary electron beam deflection range of the representative primary electron beam;

calculating, using the plurality of coordinates acquired, secondary electron beam deflection conditions such that a movement of the representative secondary electron beam due to a movement of the representative primary electron beam in the primary electron beam deflection range of the representative primary electron beam is canceled and an irradiation position of the representative secondary electron beam to the predetermined detection element is fixed; and acquiring a secondary electron image of the substrate by detecting multiple secondary electron beams by the multi-detector while performing scanning with the multiple primary electron beams over a primary electron beam deflection range of the multiple primary electron beams on the substrate placed on the stage, and performing scanning with the multiple secondary electron beams emitted from the substrate due to beam deflection based on calculated secondary electron beam deflection conditions.

2. The method according to claim 1, wherein positions of four corners of the primary electron beam deflection range of the representative primary electron beam are used as the plurality of positions.

3. The method according to claim 1, wherein the secondary electron beam deflection conditions include a deflection magnification and a deflection rotation angle.

4. The method according to claim 1, wherein a center beam of the multiple primary electron beams is used as the representative primary electron beam.

5. The method according to claim 1, wherein each of beams at four corners of the multiple primary electron beams is used as the representative primary electron beam, and a statistic value of values each calculated for the each of the beams at the four corners is used for the secondary electron beam deflection conditions.

6. The method according to claim 1 further comprising:

synthesizing detected images of the representative secondary electron beam each of which has been detected at the any one of the plurality of positions in the primary electron beam deflection range of the representative primary electron beam, wherein the plurality of coordinates are acquired using a synthetic image obtained by the synthesizing the detected images.

7. The method according to claim 1, further comprising:

selecting the representative primary electron beam from the multiple primary electron beams, and blocking other remaining beams.

8. The method according to claim 1, wherein in a case of applying the representative primary electron beam to the plurality of positions, other remaining beams which were not selected are together applied for irradiation, aperture images of a plurality of secondary electron beams are imaged together in a detected image of the representative secondary electron beam detected at each of the plurality of positions, and using the detected image in which the aperture images of the plurality of secondary electron beams are imaged together, the representative secondary electron beam is identified in the aperture images of the plurality of secondary electron beams.

9. A multiple electron beam image acquisition apparatus comprising:

a stage configured to place a substrate thereon;

a primary deflector configured to apply a representative primary electron beam selected from multiple primary electron beams to a plurality of positions in a primary electron beam deflection range of the representative primary electron beam having been preset above the stage;

a secondary deflector configured to perform scanning with a representative secondary electron beam emitted from a position concerned due to application of the representative primary electron beam, based on temporary secondary electron beam deflection conditions, for each of the plurality of positions in the primary electron beam deflection range of the representative primary electron beam;

a multi-detector configured to include a plurality of detection elements and to detect the representative secondary electron beam with which the scanning has been performed based on the temporary secondary electron beam deflection conditions, for the each of the plurality of positions in the primary electron beam deflection range of the representative primary electron beam, by a predetermined detection element of the plurality of detection elements;

a coordinate acquisition circuit configured to acquire a plurality of coordinates corresponding to the plurality of positions, based on detected images of the representative secondary electron beam each of which has been detected at any one of the plurality of positions in the primary electron beam deflection range of the representative primary electron beam; and a deflection condition calculation circuit configured to calculate, using the plurality of coordinates acquired, secondary electron beam deflection conditions such that a movement of the representative secondary electron beam due to a movement of the representative primary electron beam in the primary electron beam deflection range of the representative primary electron beam is canceled and an irradiation position of the representative secondary electron beam to the predetermined detection element is fixed, wherein a secondary electron image of the substrate is acquired by detecting multiple secondary electron beams by the multi-detector while the primary deflector performs scanning with the multiple primary electron beams over a primary electron beam deflection range of the primary electron beam on the substrate placed on the stage, and the secondary deflector performs scanning with the multiple secondary electron beams emitted from the substrate due to beam deflection based on calculated secondary electron beam deflection conditions.

10. A multiple electron beam inspection apparatus comprising:
a stage configured to place a substrate thereon;
a primary deflector configured to apply a representative primary electron beam selected from multiple primary electron beams to a plurality of positions in a primary electron beam deflection range of the representative primary electron beam having been preset above the stage;
a secondary deflector configured to perform scanning with a representative secondary electron beam emitted from a position concerned due to application of the representative primary electron beam, based on temporary secondary electron beam deflection conditions, for each of the plurality of positions in the primary electron beam deflection range of the representative primary electron beam;
a multi-detector configured to include a plurality of detection elements and to detect the representative secondary electron beam with which the scanning has been performed based on the temporary secondary electron beam deflection conditions, for the each of the plurality of positions in the primary electron beam deflection range of the representative primary electron beam, by a predetermined detection element of the plurality of detection elements;
a coordinate acquisition circuit configured to acquire a plurality of coordinates corresponding to the plurality of positions, based on detected images of the representative secondary electron beam each of which has been detected at any one of the plurality of positions in the primary electron beam deflection range of the representative primary electron beam; and
a deflection condition calculation circuit configured to calculate, using the plurality of coordinates acquired, secondary electron beam deflection conditions such that a movement of the representative secondary electron beam due to a movement of the representative primary electron beam in the primary electron beam deflection range of the representative primary electron beam is canceled and an irradiation position of the representative secondary electron beam to the predetermined detection element is fixed,
wherein a secondary electron image of the substrate is acquired by detecting multiple secondary electron beams by the multi-detector while the primary deflector performs scanning with the multiple primary electron beams over a primary electron beam deflection range of the multiple primary electron beams on the substrate placed on the stage, and the secondary deflector performs scanning with the multiple secondary electron beams emitted from the substrate due to beam deflection based on calculated secondary electron beam deflection conditions,
further comprising:
a comparison circuit configured to compare at least a portion of the secondary electron image acquired with a predetermined image.

11. A multiple electron beam image acquisition apparatus comprising:
a stage configured to place a substrate thereon;
a primary deflector configured to apply a representative primary electron beam which represents multiple primary electron beams to a plurality of positions in a primary electron beam deflection range of the representative primary electron beam having been preset above the stage in order while shifting a time of applying the representative primary electron beam;
a secondary deflector configured to perform scanning with a representative secondary electron beam emitted from a position concerned due to application of the representative primary electron beam, based on temporary secondary electron beam deflection conditions, for each of the plurality of positions in the primary electron beam deflection range of the representative primary electron beam;
a multi-detector configured to include a plurality of detection elements and to detect the representative secondary electron beam with which the scanning has been performed based on the temporary secondary electron beam deflection conditions, for the each of the plurality of positions in the primary electron beam deflection range of the representative primary electron beam, by a predetermined detection element of the plurality of detection elements;
an image synthesis circuit configured to synthesize detected images of the representative secondary electron beam, each of which has been detected at any one of the plurality of positions in the primary electron beam deflection range of the representative primary electron beam; and
a deflection condition calculation circuit configured to calculate, using a synthesized image, secondary electron beam deflection conditions such that a movement of the representative secondary electron beam due to a movement of the representative primary electron beam in the primary electron beam deflection range of the representative primary electron beam is canceled and an irradiation position of the representative secondary electron beam to the predetermined detection element is fixed,
wherein a secondary electron image of the substrate is acquired by detecting multiple secondary electron beams by the multi-detector while the primary deflector performs scanning with the multiple primary electron beams over a primary electron beam deflection range of the multiple primary electron beams on the substrate placed on the stage, and the secondary deflector performs scanning with the multiple secondary electron beams emitted from the substrate due to beam deflection based on calculated secondary electron beam deflection conditions.

12. A multiple electron beam inspection apparatus comprising:
a stage configured to place a substrate thereon;
a primary deflector configured to apply a representative primary electron beam which represents multiple primary electron beams to a plurality of positions in a primary electron beam deflection range of the representative primary electron beam having been preset above the stage in order while shifting a time of applying the representative primary electron beam;
a secondary deflector configured to perform scanning with a representative secondary electron beam emitted from a position concerned due to application of the representative primary electron beam, based on temporary secondary electron beam deflection conditions, for each of the plurality of positions in the primary electron beam deflection range of the representative primary electron beam;

a multi-detector configured to include a plurality of detection elements and to detect the representative secondary electron beam with which the scanning has been performed based on the temporary secondary electron beam deflection conditions, for the each of the plurality of positions in the primary electron beam deflection range of the representative primary electron beam, by a predetermined detection element of the plurality of detection elements;

an image synthesis circuit configured to synthesize detected images of the representative secondary electron beam, each of which has been detected at any one of the plurality of positions in the primary electron beam deflection range of the representative primary electron beam; and a deflection condition calculation circuit configured to calculate, using a synthesized image, secondary electron beam deflection conditions such that a movement of the representative secondary electron beam due to a movement of the representative primary electron beam in the primary electron beam deflection range of the representative primary electron beam is canceled and an irradiation position of the representative secondary electron beam to the predetermined detection element is fixed, wherein a secondary electron image of the substrate is acquired by detecting multiple secondary electron beams by the multi-detector while the primary deflector performs scanning with the multiple primary electron beams over a primary electron beam deflection range of the multiple primary electron beams on the substrate placed on the stage, and the secondary deflector performs scanning with the multiple secondary electron beams emitted from the substrate due to beam deflection based on calculated secondary electron beam deflection conditions, further comprising:

a comparison circuit configured to compare at least a portion of the secondary electron image acquired with a predetermined image.

* * * * *